United States Patent [19]
Matsuoka et al.

[11] Patent Number: 6,130,449
[45] Date of Patent: Oct. 10, 2000

[54] SEMICONDUCTOR MEMORY DEVICE AND A METHOD FOR FABRICATING THE SAME

[75] Inventors: Hideyuki Matsuoka, Houya; Shinichiro Kimura, Kunitachi; Toshiaki Yamanaka, Iruma, all of Japan

[73] Assignee: Hitachi, Ltd., Tokyo, Japan

[21] Appl. No.: 08/943,592

[22] Filed: Oct. 3, 1997

[30] Foreign Application Priority Data

Oct. 4, 1996 [JP] Japan .................................. 8-264075

[51] Int. Cl.[7] ........................ H01L 27/108; H01L 29/76; H01L 29/94; H01L 31/119; H01L 29/40
[52] U.S. Cl. ........................ 257/296; 257/306; 257/758
[58] Field of Search .................. 257/296–310, 257/758; 438/243–253, 396–399; 565/149

[56] References Cited

U.S. PATENT DOCUMENTS

| | | | |
|---|---|---|---|
| 5,364,811 | 11/1994 | Ajika et al. ............................. | 438/396 |
| 5,414,655 | 5/1995 | Ozaki et al. ............................ | 257/303 |
| 5,448,512 | 9/1995 | Hachisuka et al. ..................... | 365/149 |
| 5,623,164 | 4/1997 | Auer et al. .............................. | 257/758 |
| 5,717,251 | 2/1998 | Hayashi et al. ......................... | 257/758 |
| 5,748,521 | 5/1998 | Lee ......................................... | 365/149 |
| 5,838,038 | 11/1998 | Takashima et al. ..................... | 257/296 |

*Primary Examiner*—Minh Loan Tran
*Assistant Examiner*—Cuong Q Nguyen
*Attorney, Agent, or Firm*—Antonelli, Terry, Stout & Kraus, LLP

[57] ABSTRACT

A semiconductor memory device and a method of fabricating the same are provided, in which an interlayer film which only covers a peripheral circuit region except a memory cell array region is formed above the peripheral circuit region to reduce a topological difference between both regions after bitlines are formed, therefore a semiconductor substrate which has a plain surface as a main one can be used as a starting body with no preliminary processing thereon and a shallow trench isolation technique can also be applied, besides interconnects to the peripheral circuit can be led up to the surface of the device through a multi-step plug connection and thereby processing of large aspect-ratio holes, stuffing of metal in the holes and the like are unnecessary and as a result reliability of the process is improved.

3 Claims, 23 Drawing Sheets

SEMICONDUCTOR MEMORY DEVICE AND A METHOD FOR FABRICATING THE SAME

FIELD OF THE INVENTION

The present invention relates to a semiconductor memory device having a fine structure and a large charge capacity. More particularly, the present invention relates to a dynamic random access memory which is suitable for a higher integration complexity.

BACKGROUND OF THE INVENTION

While a dynamic random access memory has heretofore been provided for improving integration complexity at a speed larger by a factor of four in three years, the volume demand for the memory has increased more and more in keeping with the explosive sales of personal computers in recent years. Mass production facilities for devices of 16 M bits are almost in the final stage of operation and, furthermore, development toward mass production of devices of 64 M bits, which uses a linewidth of 0.35 $\mu$m, is currently being advanced, said linewidth being a key element in a technology of miniaturization to be employed in the next generation of memory devices.

To achieve a memory cell on a smaller scale, a three dimensional structure of a capacitor has been adopted in generations after the fourth generation in order to secure a larger capacitance in a smaller area. In employment of this structure of a capacitor, however, the height of a capacitor has been on the increase in every generation, since the magnitude of the required charge capacity has almost not, changed through the generations. As a result, in the case where a COB cell (COB is an abbreviation for Capacitor Over Bitline) in which a capacitor is formed above a dataline is employed, a high topological difference is produced between a memory cell region and a peripheral circuit region.

In more detail, for example, in the case of 1 G bits, which is a generation following the next generation, the height of a capacitor is about 1 $\mu$m, provided that a tantalum oxide film (which is equivalent to a silicon oxide film of a thickness of 3.3 nm) as a capacitor insulating film is used and a cylindrical capacitor is adopted. In the presence of a topological difference of such a magnitude between a memory cell array and a peripheral circuit region, the following steps in the formation of the metal interconnection have experienced much difficulty, that is, the steps of photolithography and dry etching could not be properly performed. In the photolithography step, since resolution and depth of focus are inversely proportional to each other, the depth of focus becomes smaller as the resolution is increased in order to achieve a finer pattern. Therefore, if a high topological difference is present, poor resolution results, thereby to adversely affect the patterning. On the other hand, in the dry etching step, if a high topological difference is present, there also arises problems that a film is partly left unetched or the resulting pattern is misshaped relative to its intended configuration.

As a means to solve such problems, there has been proposed a method in which, as shown in FIG. 2, an Si substrate is prepared in such a way that an intentional topological difference is provided on the substrate and the topological difference is adjusted so that a region of the surface on which the memory array is formed is lower in height than another region of the surface on which the peripheral circuit is formed, whereby the topological difference between a memory array region and a peripheral circuit region is reduced (see Laid-Open Japanese patent application 63-266866). However, it is difficult to apply this technique to a DRAM of 1 G bits class which requires a minimum process size of 0.15 $\mu$m. The following are the reasons for such difficulty.

In the technique disclosed in a publication of Laid-Open Japanese patent application 63-266866, a semiconductor substrate (or wafer) as a starting material is prepared with a topological difference, and therefore the height of the surface of a device isolation region is not uniform thereacross, that is, the height is different between a memory array region and the peripheral circuit region. Conventionally there has been generally adopted a technique in which an oxide film is selectively formed (this is called LOCOS: Local Oxidation of Silicon), and such a device isolation region has been formed in a wafer with a high step by this technique. In a 1 G bits DRAM, however, the required size for device isolation is 0.15 $\mu$m. A LOCOS technique cannot be, in such a condition, applied to a 1 G bits DRAM in order to electrically isolate elements, and so it has been considered that a shallow trench isolation technique (abbreviated as STI) should be adopted instead. According to the STI technique, a thick oxide film is buried in a trench formed on a silicon surface, and thereafter the silicon surface is uniformly polished off, so that the oxide film is locally buried. If a topological difference is present on a substrate, a bottom of the topological difference is buried thereacross with the oxide film, and so that it should be concluded that the technique disclosed in the publication of Laid-Open Japanese patent application 63-266866 cannot be applied in this situation.

SUMMARY OF THE INVENTION

It is, accordingly, an object of the present invention to provide a technique in which a topological difference between a memory array region and peripheral circuit region is reduced, said topological difference being a serious problem in fabrication of a semiconductor memory device, or more specifically, a DRAM, having a integration complexity of 1 G bits or larger.

Typical aspects of the present invention will be described.

A first aspect of the present invention is directed to a semiconductor memory device comprising: a semiconductor substrate; a memory cell array formed on a main surface of the semiconductor substrate in a memory cell array region, the array comprising an arrangement of a plurality of memory cells each constructed from one select transistor and one storage capacitor; a peripheral circuit formed on the main surface of the semiconductor substrate in a peripheral circuit region, the peripheral circuit comprising a plurality of MISFETs arranged in the region, said region being disposed in the periphery of the memory cell array region; a first interlayer insulating film having a predetermined thickness formed in the peripheral region; a recess formed in the first interlayer insulating film, the recess being included in the memory cell array region; a bitline formed in the memory cell array region, wherein the storage capacitor is disposed above the bitline; and a second interlayer insulating film formed so that the storage capacitor and the first interlayer insulating film are covered with the second film; and a plurality of interconnection layers formed on the second interlayer insulating film.

A second aspect of the present invention is directed to a semiconductor memory device comprising: a semiconductor substrate; a memory cell array formed on a main surface of the semiconductor substrate in a memory cell array region, the array comprising an arrangement of a plurality of memory cells each constructed from one select transistor and one storage capacitor; a peripheral circuit formed on the main surface of the semiconductor substrate in a peripheral circuit region, the peripheral circuit comprising a plurality of MISFETs arranged in the region, said region being disposed in the periphery of the memory cell array region; a first interlayer insulating film having a predetermined thickness formed in the peripheral region; a recess formed in the first interlayer insulating film, the recess being included in the memory cell array region; a first contact hole opened in the first interlayer insulating film; a first plug made of a first conducting layer buried in the first contact hole with electrical connection to a MISFET; a bitline formed in the memory cell array region, wherein a plurality of storage capacitors are disposed above bitlines; a plate electrode used in common for the storage capacitors; a dielectric film lying between the plate electrode and lower electrodes as storage nodes of the storage capacitors in such a manner that the dielectric film may cover the lower electrodes, wherein part of the plate electrode is extended onto the first interlayer insulating film in the peripheral circuit region; a second interlayer insulating layer covering the plate electrode and the first interlayer insulation film; a plurality of second contact holes opened in the second interlayer insulating film above the part of the plate electrode and in an aligning relation with plugs made of the first conducting layer; second plugs made of a second conducting layer respectively buried in the second contact holes in the second interlayer insulating film, the second plugs being connected with the part of the plate electrode and the first plugs made of the first conducting layer; and a plurality of interconnection layers, formed on the second interlayer insulating film, respectively connected with the second plugs made of the second conducting layer.

A third aspect of the present invention is directed to a semiconductor memory device comprising: a semiconductor substrate; a shallow trench isolation film selectively formed on a main surface of the semiconductor substrate; a memory cell array formed on the main surface of the semiconductor substrate in a memory cell array region, the array comprising an arrangement of a plurality of memory cells each constructed from one select transistor and one storage capacitor; a peripheral circuit formed on the main surface of the semiconductor substrate in a peripheral circuit region, the peripheral circuit comprising a plurality of MISFETs arranged in the region, said region being disposed in the periphery of the memory cell array region, a first interlayer insulating film having a predetermined thickness formed in the peripheral region; a recess formed inside the first interlayer insulating film, the recess being included in the memory cell array region; a first contact hole opened in the first interlayer insulating film; a first plug made of a first conducting layer buried in the contact hole with electrical connection to a MISFET; a bitline formed in the memory cell array region, wherein a plurality of storage capacitors are disposed above bitlines; a plate electrode used in common for the storage capacitors; a dielectric film lying between the plate electrode and lower electrodes as storage nodes of the storage capacitors in such a manner that the dielectric film may cover the lower electrodes, wherein part of the plate electrode is extended onto the first interlayer insulating film in the peripheral circuit region; a second interlayer insulating layer covering the plate electrode and the first interlayer insulation film; a plurality of second contact holes formed in the second interlayer insulating film above the part of the plate electrode and in an aligning relation with plugs made of the first conducting layer; second plugs made of a second conducting layer respectively buried in the second contact holes in the second interlayer insulating film, the second plugs being connected with the part of the plate electrode and the first plugs made of the first conducting layer; and a plurality of interconnection layers, formed on the second interlayer insulating film, respectively connected with the second plugs made of the second conducting layer.

A fourth aspect of the present invention is directed to a method of fabricating a semiconductor memory device comprising: a semiconductor substrate; a memory cell array formed on a main surface of the semiconductor substrate in a memory cell array region, the array comprising an arrangement of a plurality of memory cells each constructed from one select transistor and one storage capacitor; and a peripheral circuit formed on the main surface of the semiconductor substrate in a peripheral circuit region, the peripheral circuit comprising a plurality of MISFETs arranged in the region, said region being disposed in the periphery of the memory cell array region, which method comprises the steps of: forming a recess on the substrate by only covering a peripheral circuit region with a first interlayer insulating film after a bitline is formed; forming a plurality of storage capacitors; forming a second interlayer insulating film on the main surface of the semiconductor substrate on which surface a topological difference between the memory cell array region and peripheral circuit region is reduced; and forming a plurality of interconnection layers by patterning on the second interlayer insulating film.

BRIEF DESCRIPTION OF THE DRAWINGS

Novel features which are considered characteristic of the present invention are set forth with particularity in the appended claims.

The invention itself, however, and additional objects and advantages thereof will best understood from the following description thereof when read in connection with accompanying drawings, in which.

DETAILED DESCRIPTION OF THE PREFERRED EMBODIMENTS

Embodiments of the present invention will be described with reference to the accompanying drawings.

Embodiment 1

A structure of a DRAM, which represents an embodiment of the present invention, will be described with reference to FIG. 1. In the sectional view shown in the figure, a memory array region, in which memory array cells are formed, is disposed on the left side of the thickness-wise middle portion, and a peripheral circuit region, in which a peripheral circuit is formed, is disposed on the right side of the thickness-wise middle portion. In other words, FIG. 1 shows a partial cross-sectional view of a memory cell array device and a peripheral circuit device respectively fabricated in regions on a semiconductor substrate in a similar manner to those of a conventional semiconductor substrate.

Figure 1:
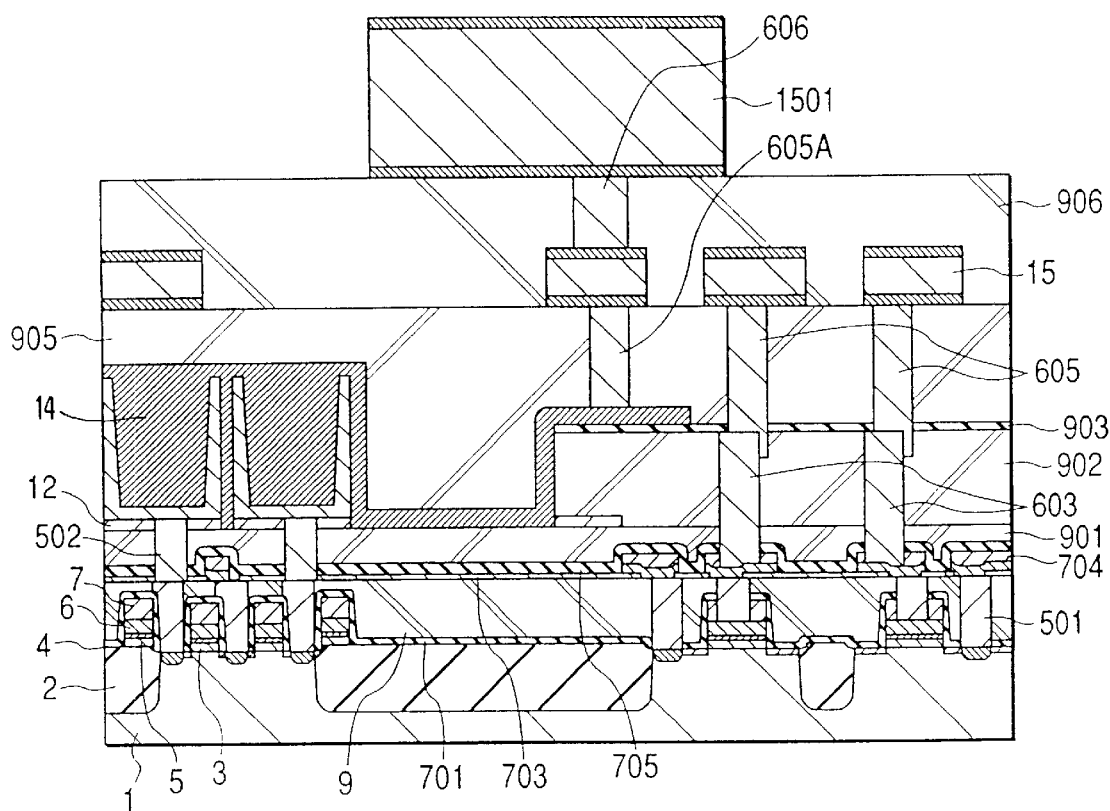
FIG. 1 is a sectional view of a semiconductor memory device of the present invention.
Figure 2:
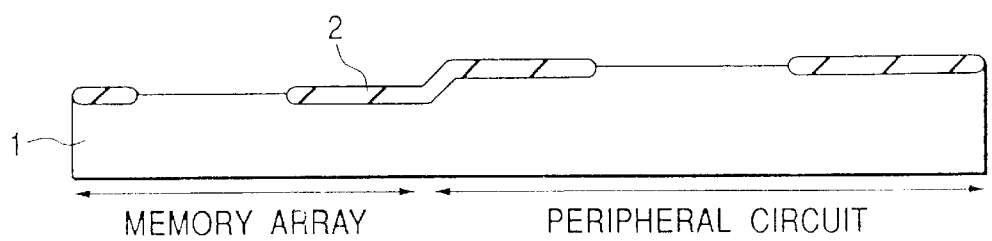
FIG. 2 is a sectional view of a substrate as starting material for a semiconductor memory device according to a conventional technique.

In FIG. 1, a so-called interdevice isolation oxide film 2 for isolation between a plurality of metal insulator semiconductor field effect transistors (abbreviated as MISFET) is formed on a main surface of the silicon (Si) semiconductor substrate 1. The interdevice isolation oxide film 2 is formed by means of a shallow trench isolation (abbreviated as STI) technique, which will be described in detail later and the topological difference between the oxide film and the original main surface of the substrate 1 is small. In the memory cell array region, a gate oxide ($SiO_2$) film 3 is formed on the main surface of the semiconductor substrate 1 and on the gate oxide film, and thereafter a low-resistance gate electrode with a three-layer structure, constructed from a polysilicon layer 4, a titanium nitride (TiN) layer 5 and a tungsten (W) layer 6 arranged upwardly in this order is formed to complete a plurality of select transistors. The gate electrode is covered with a silicon nitride (SiN) film.

MISFETs in the peripheral circuit region are also constructed to have the same structure as that of a select transistor in the memory cell array region. A silicon oxide ($SiO_2$) film 9 as an interlayer insulating film is formed all over the main surface of the substrate 1, so that the silicon oxide film 9 may cover the select transistors and MISFETs. Contact holes are formed in the silicon oxide film 9, said contact holes 9 being used for interconnection to semiconductor regions (source and drain) selectively formed on the main surface of the substrate 1. In detail, contact holes for bitlines and storage nodes are formed in the silicon oxide film 9. Titanium nitride (TiN) is stuffed in the contact holes as plugs. Bitlines 601A and interconnect metallizations 601B are formed on the silicon oxide film 9. A silicon oxide film 901 is formed as an interlayer insulating film in a such manner that the silicon oxide film 901 may cover the bitlines 601A and interconnect metallizations 610B. Contact holes for the storage nodes are further formed in the silicon oxide film 901 almost in alignment with the respective contact holes in the oxide film 9, wherein an offset is tolerated to a small extent between central axes of two contact holes to be aligned with each other. A TiN plug 502 is formed in a contact hole for a storage node.

A structure constituting a characteristic feature of the present invention is constructed from a storage capacitor in a memory cell array formed on the silicon oxide film 901 and interconnection in the peripheral circuit region.

A lower electrode 12 of a storage capacitor which contacts a TiN plug 502 is formed on a portion of the silicon oxide film 901 in the memory cell array region. On the other hand, on a portion of the silicon oxide film 901 in the peripheral circuit region,there is selectively formed an interlayer insulating film (a first interlayer insulating film) 902, 903. In other words, an interlayer insulating film only covering the peripheral circuit region is further formed on the existing insulating film of the peripheral circuit region and the memory cell array region is accommodated in a recess resulting from local formation of the interlayer insulating film on the peripheral circuit region.

Lower electrodes 12A in the shape of a cylinder are formed on respective lower electrodes 12 disposed in the memory cell array region or the recess, and each of the lower electrodes 12A is higher than the surface level of the interlayer insulating film (the first interlayer insulating film) 902, 903 covering the peripheral circuit in order to increase the charge capacity. In other words, the upper surface level of the interlayer film (the first interlayer insulating film) 902, 903 locally covering the substrate is positioned lower than the upper surface of each of the storage capacitors.

An insulating film with a small thickness, serving as a dielectric of the storage capacitor, covers the surfaces of the inner and outer walls of a lower electrode 12A. The insulating film is not shown in FIG. 1. Upper electrodes 14 of a plate electrode used in common are formed in a buried manner on a plurality of lower electrodes 12A each in the shape of a cylinder in the memory cell array region, and the upper surface of the upper electrode 14 is made planar. Part of the upper electrode 14 is patterned so as to be extended onto the interlayer film (the first interlayer insulating film) 902, 903, which locally covers the substrate. A further interlayer insulating film (a second interlayer insulating film) 905 is formed in a planar state all over the upper electrodes 14 and interlayer film (the first interlayer insulating film) 902, 903 only covering the peripheral circuit region. Contact holes are further formed in the interlayer insulating film (the second interlayer insulating film) 905 with almost the same aspect ratio as the holes in the interlayer film 902, 903, wherein at least one contact hole is used to expose part of the upper electrode 14 and the others are used to expose the upper portion of W plugs 605 stuffed in the holes in the interlayer film (the first interlayer insulating film) 902, 903. That is, these contact holes in a plural number are opened at the same time in one processing step. W plugs 605A for lead connection of the plate electrode and the W plugs 605 for lead connection of the peripheral circuit are formed in the holes opened in the interlayer insulating film (the second interlayer insulating film) 905.

A plurality of first interconnect lines 5 with a multi-layered structure of titanium nitride/aluminum/titanium nitride respectively connected with the W plug 605A for lead connection of the plate electrode and the W plugs 605 for lead connection of the peripheral circuit are formed by patterning on the interlayer insulating film (the second interlayer insulating film) 905 on whose surface there is almost no topological difference. A still further interlayer insulating film (a third interlayer insulating film) 906 is formed on the first interconnect lines in a plural number so as to cover the lines. A W plug 606 for lead connection of the plate electrode is formed in a buried manner in a contact hole formed in the interlayer insulating film (the third interlayer insulating film) 906.

Second interconnect lines 1501 with a multi-layered structure of titanium nitride/aluminum/titanium nitride which are connected with a W plug 606 for lead connection of the plate electrode are formed by patterning on the almost topological difference-free surface of the interlayer insulating film(the third interlayer insulating film) 906.

An embodiment of the present invention in the case of a DRAM having a folded-bitline arrangement will be described with reference to each of the steps in fabrication of a semiconductor memory device thereof, as shown in FIGS. 3 to 30.

In the embodiment, the above mentioned memory cell array region is, for example, a region where a plurality of memory cells are arranged in an orderly manner in a semiconductor chip, and said memory cell comprises one select transistor and one storage capacitor. Moreover, there are included a plurality of dummy cells and a sense amplifier. A peripheral circuit region is a region on the chip other than the memory cell regions, that is, a region where, for example, an address decoder, input/output buffer and the like are included. The definitions above also apply to the other Embodiments 2, 3 to be described later.

Figure 3:
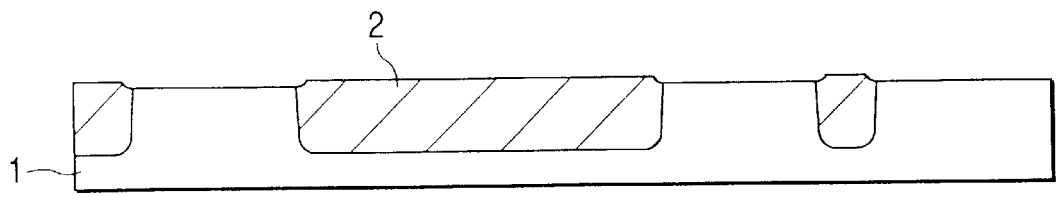
FIG. 3 is a sectional view showing a step in fabrication of a semiconductor memory device of the present invention.
Figure 4:
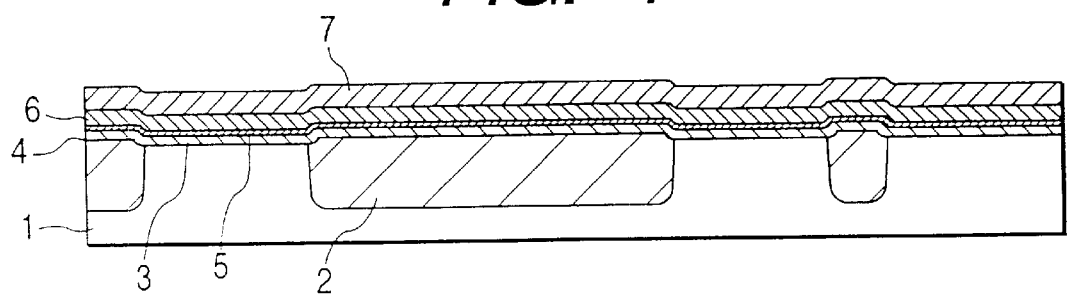
FIG. 4 is a sectional view showing a step in fabrication of a semiconductor memory device of the present invention.
Figure 5:
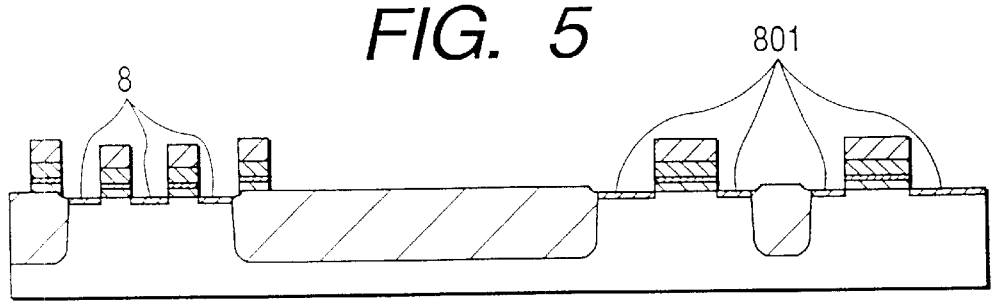
FIG. 5 is a sectional view showing a step in fabrication of a semiconductor memory device of the present invention.

To start with, a semiconductor substrate 1 is prepared for use and a shallow trench isolation region 2 is formed as shown FIG. 3. In a concrete manner, the method comprises the steps of: forming trenches of isolation with a depth of about 0.3 $\mu$m on a main surface of the substrate 1 by a known selective dry etching method; removing damages caused by dry etching on the surfaces of the side walls and bottom; thereafter depositing a silicon oxide film with a thickness of about 0.4 $\mu$m by means of a known CVD (which is an abbreviation of Chemical Vapor Deposition) method; selectively polishing off the oxide film formed on a region other than the trenches of the surface of the substrate 1 by means of a known CMP (which is an abbreviation of Chemical Mechanical Polishing) method while leaving the oxide film 2 in the trenches; subsequently implanting impurity ions into regions on the substrate 1 in order to form well regions and punch-through stopper regions; then forming a patterned gate oxide film 3; and depositing polysilicon 4 on the gate oxide film 3 by a known CVD method. In order to form a dual gate, phosphorus ions were implanted in an n-gate region under conditions of an energy of 5 keV and a dose of $2 \times 10^{15}$ cm$^{-2}$ and boron ions were implanted in a p-gate region in conditions of an energy of 2 keV and a dose of $2 \times 10^{15}$ cm$^{-2}$. It is needless to say that arsenic and BF2 may be respectively substituted for phosphorus and boron. Subsequently, in order to decrease the resistance of a wordline, TiN 5 was spattered to a thickness of 20 nm and W 6 was then spattered to a thickness of 80 nm on the polysilicon 4. TiN 5 was spattered in order to suppress a silicidation between the polysilicon 4 and W 6, although WN can be substituted for TiN5. SiN 7 was deposited to a thickness of 100 nm by a CVD method on the W6 for the use as a self-aligned contact, which is shown in FIG. 4. The layers of SiN/W/TiN/poly-Si thus formed were processed to obtain gate electrodes by means of a known dry etching, as shown in FIG. 5.

Figure 6:
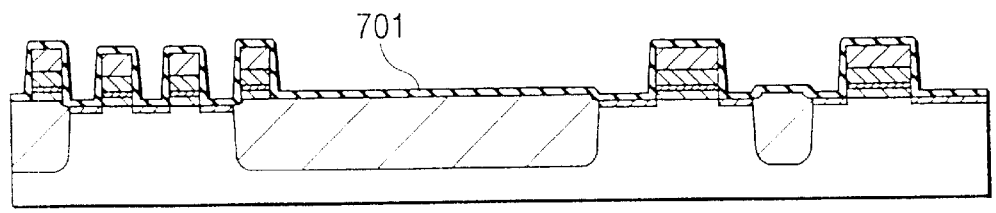
FIG. 6 is a sectional view showing a step in fabrication of a semiconductor memory device of the present invention.
Figure 7:
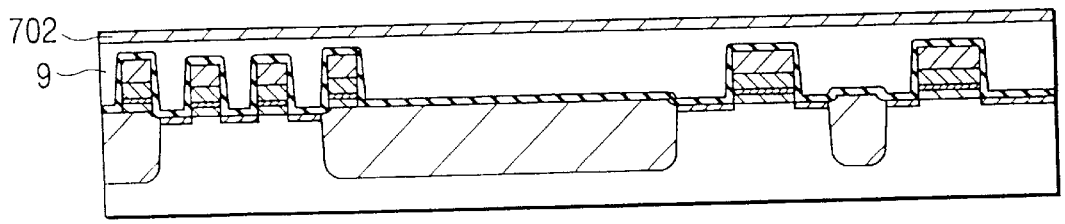
FIG. 7 is a sectional view showing a step in fabrication of a semiconductor memory device of the present invention.
Figure 8:
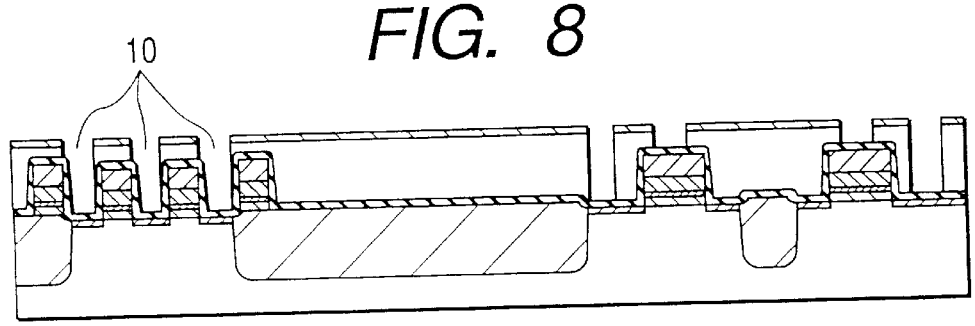
FIG. 8 is a sectional view showing a step in fabrication of a semiconductor memory device of the present invention.

In order to form diffused layers of MOSFETs, arsenic ions were implanted under conditions of an energy of 20 keV and a dose of $1 \times 10^{15}$ cm$^{-2}$ for a n-MOSFET, and BF2 ions were implanted in conditions of an energy of 20 keV and a dose of $1 \times 10^{13}$ cm$^{-2}$ for a p-MOSFET. SiN 701 was then deposited to a thickness of 50 nm by means of a CVD method to obtain the device in process as shown in FIG. 6. An oxide film 9 of a thickness of 350 nm was deposited all over the substrate 1 by means of a CVD method and the surface of the oxide film 9 was made planar before a deposition of SiN 702 to a thickness of 50 nm which was used as a mask for processing contact holes, the device in process at this stage being shown in FIG. 7. A photoresist pattern was formed on the SiN 702 to open windows each of a diameter of 0.15 μm for bitlines and storage nodes and the oxide film 9 was subsequently processed using a patterned SiN layer as a mask to expose the SiN 701 which is a substrate, as shown in FIG. 8. In this case, all the gate electrodes were completely covered with SiN and therefore the gate electrodes had no chance to be exposed in the course of the above processing of the oxide film 9. The SiN film 702 was consumed by about 30 nm in thickness during the above processing of the oxide film 9 to a thickness of 20 nm. In such a way, fine holes of a diameter as small as 0.15 μm were able to be processed using an SiN film instead of a resist film in a processing step of the oxide film 9. Subsequently, dry etching was applied to remove SiN of a thickness of 50 nm to expose the surface of the diffused layers formed in the substrate 1. The SiN 702 on the upper surface which had been used as a mask was naturally removed at the same time. In a further dry etching, the SiN of a thickness of 100 nm above the gates of the peripheral circuit, which is unnecessary, was also removed.

Figure 9:
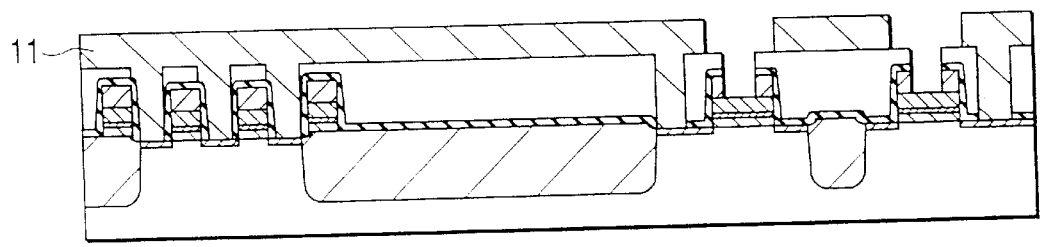
FIG. 9 is a sectional view showing a step in fabrication of a semiconductor memory device of the present invention.
Figure 10:
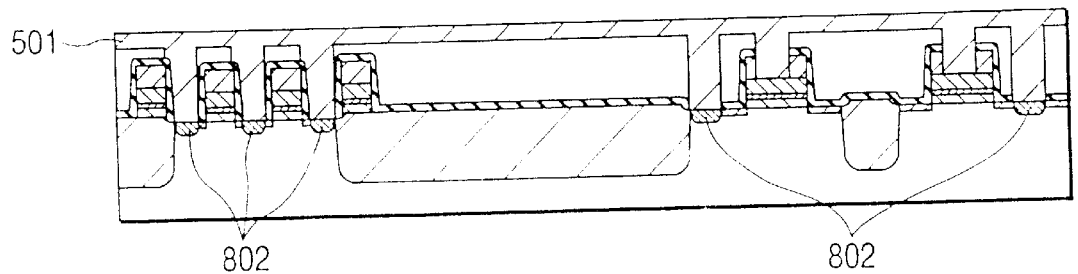
FIG. 10 is a sectional view showing a step in fabrication of a semiconductor memory device of the present invention.
Figure 11:
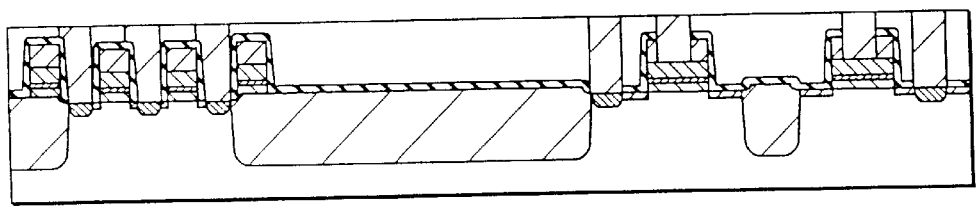
FIG. 11 is a sectional view showing a step in fabrication of a semiconductor memory device of the present invention.
Figure 12:
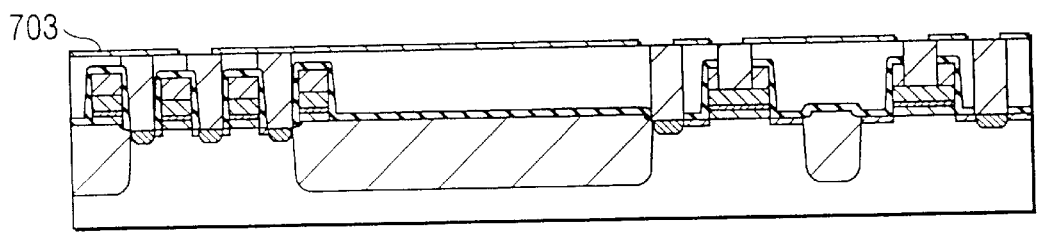
FIG. 12 is a sectional view showing a step in fabrication of a semiconductor memory device of the present invention.
Figure 13:
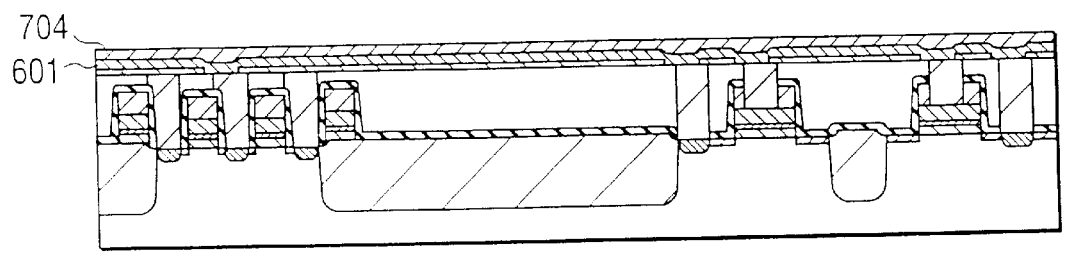
FIG. 13 is a sectional view showing a step in fabrication of a semiconductor memory device of the present invention.
Figure 14:
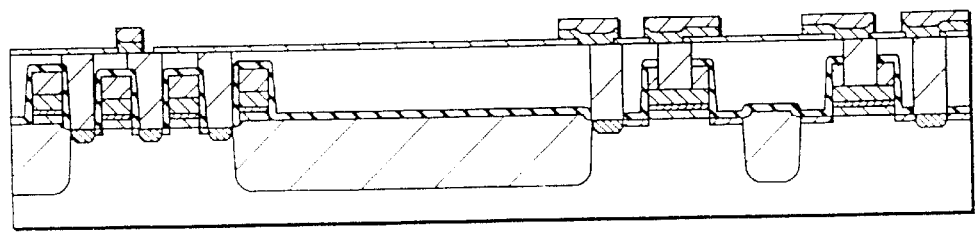
FIG. 14 is a sectional view showing a step in fabrication of a semiconductor memory device of the present invention.
Figure 15:
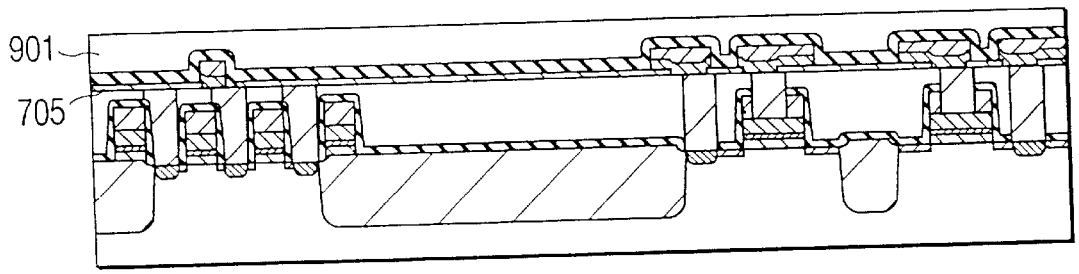
FIG. 15 is a sectional view showing a step in fabrication of a semiconductor memory device of the present invention.
Figure 16:
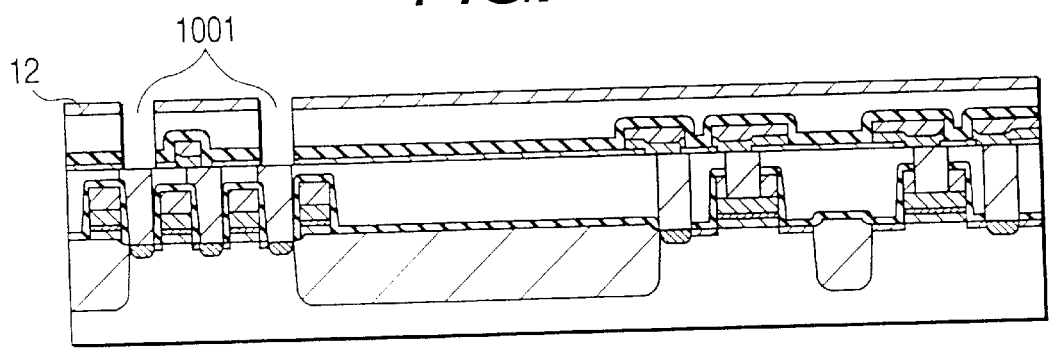
FIG. 16 is a sectional view showing a step in fabrication of a semiconductor memory device of the present invention.
Figure 17:
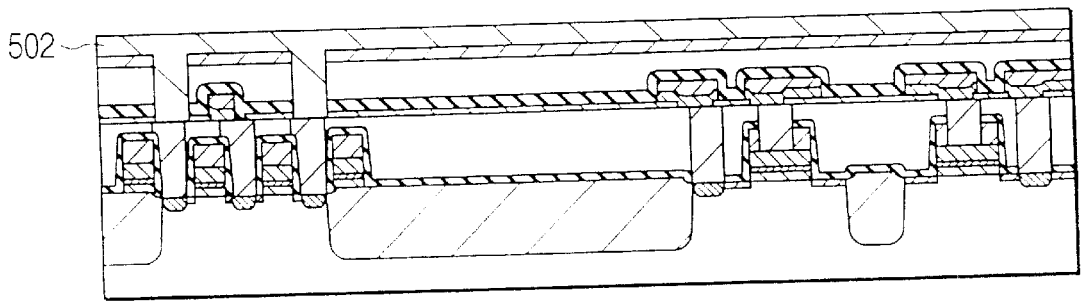
FIG. 17 is a sectional view showing a step in fabrication of a semiconductor memory device of the present invention.
Figure 18:
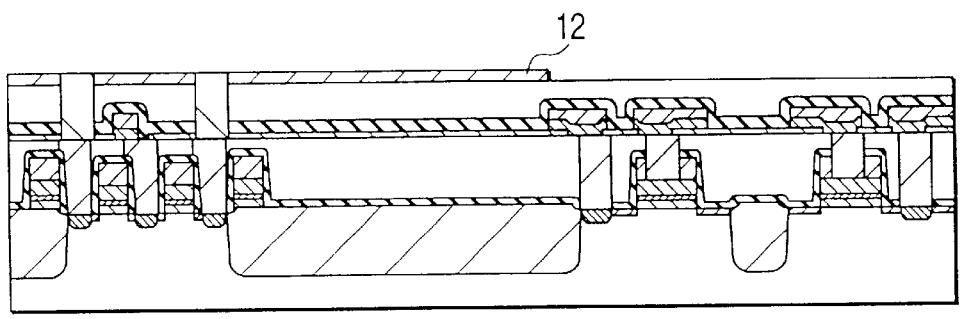
FIG. 18 is a sectional view showing a step in fabrication of a semiconductor memory device of the present invention.
Figure 19:
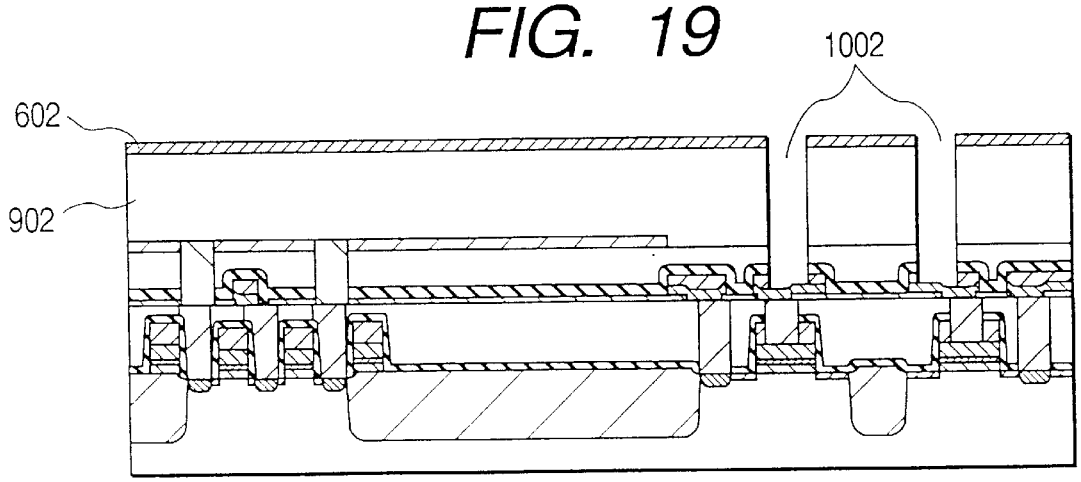
FIG. 19 is a sectional view showing a step in fabrication of a semiconductor memory device of the present invention.
Figure 20:
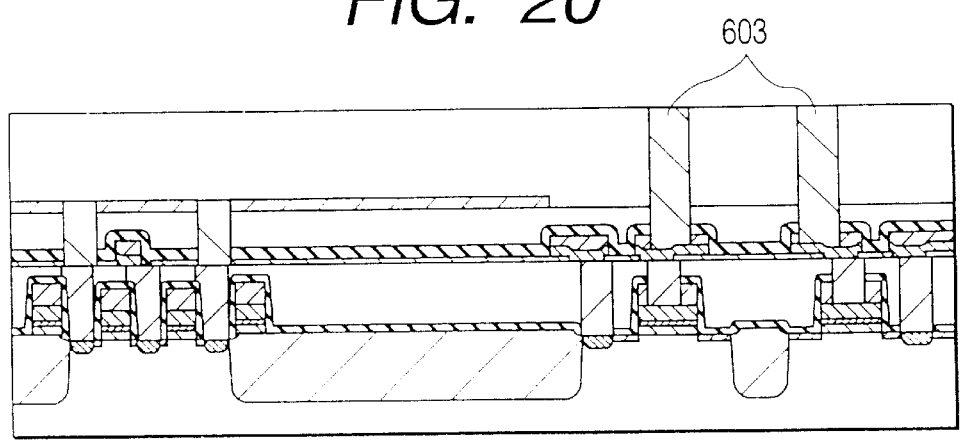
FIG. 20 is a sectional view showing a step in fabrication of a semiconductor memory device of the present invention.
Figure 21:
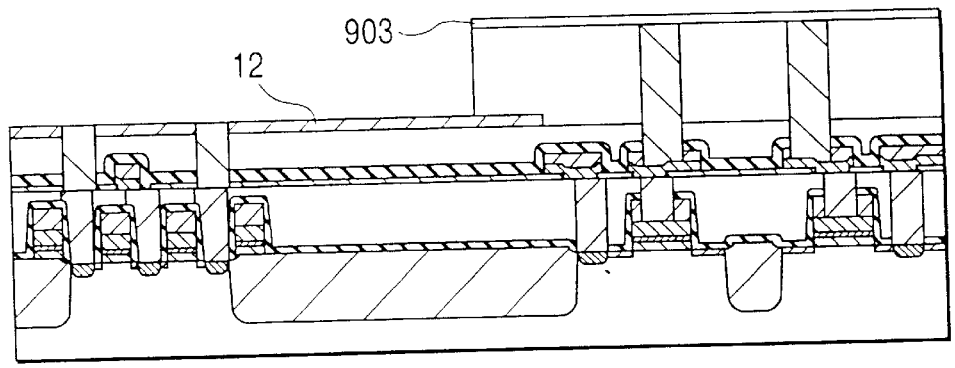
FIG. 21 is a sectional view showing a step in fabrication of a semiconductor memory device of the present invention.

As shown in FIG. 9, a further dry etching of the SiN was performed using a resist mask having openings above the respective gates of the peripheral circuit. Impurity was ion-implanted in order to reduce the resistance of a p-type diffused layer and that of a contact after the resist mask was removed. First, a p-type diffused layer region was opened in a resist mask and BF2 ions were then implanted under conditions of an energy of 20 keV and a dose of $1 \times 10^{15}$ cm$^{-2}$. Furthermore, an opening was formed above an n-type diffusion region in a resist mask which was again applied after the resist mask used in the previous ion implantation had been removed and arsenic ions were implanted under conditions of 15 keV and a dose of $1 \times 10^{15}$ cm$^{-2}$ using the resist mask. Subsequently phosphorus ions were further implanted under conditions of an energy of 25 keV and a dose of $6 \times 10^{12}$ cm$^{-2}$, which was performed in order to reduce the intensity of an electric field in a memory cell transistor. Next, TiN plugs were formed. After the resist for the impurity ion-implantation was removed, TiN 501 was deposited to a thickness of 100 nm by CVD as shown in FIG. 10. Etching back of the TiN 501 was carried out to form the TiN plugs as shown in FIG. 11. Then SiN 703 was deposited to a thickness of 20 nm by means of CVD and in succession a bitline contact 10 in the memory cell array region and contacts in the peripheral circuit region were opened in the SiN 703 layer as shown in FIG. 12. Then W 601 which was used for formation of a bitline was deposited to a thickness of 50 nm. SiN 704 was deposited to a thickness of 50 nm by means of CVD following the W 601 deposition, as shown in FIG. 13. The SiN 704 was used for preventing a short-circuit to a bitline in formation of contacts as the SiN 7 was on a gate. Resist was applied on the SiN 704 to form a mask and the SiN 704 and W 601 are dry-etched using the mask, so that a bitline and interconnect lines were respectively formed in the memory cell array region and peripheral circuit region, as shown in FIG. 14. In order to prevent a short-circuit, SiN 705 was deposited to a thickness of 50 nm after the dry-etching, an oxide film 901 as an interlayer insulating film was further deposited to a thickness of 200 nm and thereafter the surface of the oxide film 901 was made planar in an etch-back process as shown in FIG. 15. Amorphous silicon 12 containing phosphorus at a concentration of $4 \times 10^{20}$ cm$^{-3}$ was deposited to a thickness of 50 nm on the oxide film 901. The amorphous silicon 12 was to be part of a lower electrode of a capacitor. After formation of the amorphous silicon 12, memory contacts were formed. The amorphous silicon 12 was processed to form openings for contacts therein using resist as a mask and the resist was removed after the openings were formed. Dry-etching was applied to the surface of the amorphous silicon 12 as a mask with the openings to remove part of the oxide film 901 and SiN 703, 705 to form memory contacts, as shown in FIG. 16. On this occasion, the bitline was completely covered with SiN and therefore W was not exposed in this formation process of contact holes 1001. TiN 502 was deposited on the surface with openings of the contact holes 1001 by means of CVD in a manner as shown in FIG. 17. TiN plugs were formed by etching-back of the TiN 502 and the amorphous silicon film 12 on an exposed surface was processed so as to leave only part of the film 12 which covered the whole of the memory cell array, as shown in FIG. 18. In the following steps, a recess was formed which was used for reduction of a topological difference between the memory cell array region and peripheral circuit region. An oxide film 902 was deposited to a thickness of 500 nm all over the surface and W 602 was spattered to a thickness of 50 nm thereon. Resist was applied on the W 602 to form a mask and the oxide film 902 and SiN 704 and 705 were dry-etched as shown in FIG. 19. After the dry-etching, W 603 was spattered to a thickness of 150 nm, which was followed by etching-back as shown in FIG. 20. In order to prevent a reaction between W 603 and silicon which was to be later deposited, an oxide film 903 was deposited to a thickness of 50 nm after the etching-back and the recess was formed by dry-etching as shown in FIG. 21. At this time, the amorphous silicon 12 worked as a stopper in the etching of an oxide film. After the etching-back, a polysilicon layer 1201 was deposited to a thickness of 900 nm, said polysilicon layer 1201 being used to form a lower electrode of a capacitor and being naturally doped with phosphorus at a concentration of $4 \times 10^{20}$ cm$^{-3}$. Then, the polysilicon layer 1201 was processed so as to be planar.

Figure 22:
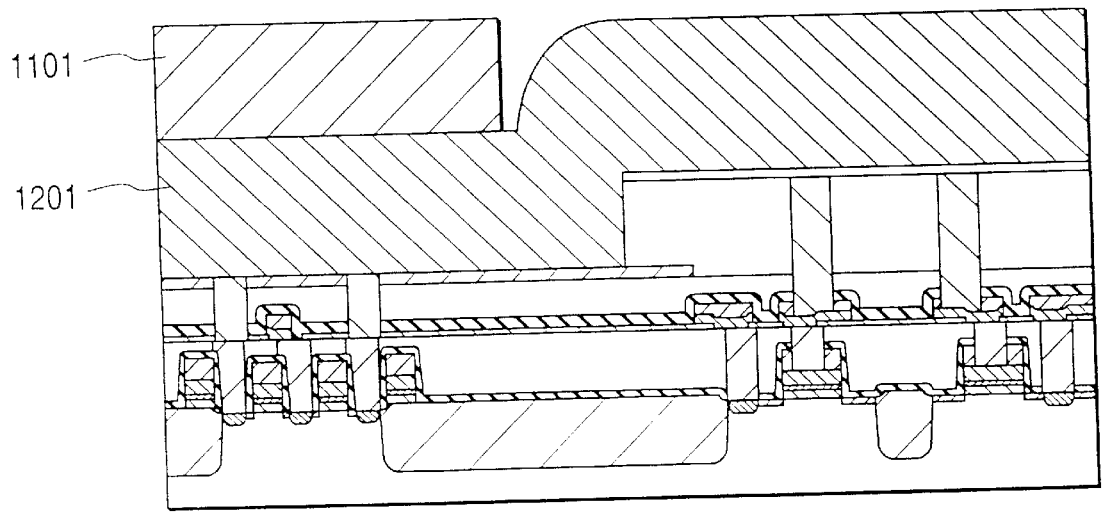
FIG. 22 is a sectional view showing a step in fabrication of a semiconductor memory device of the present invention.
Figure 23:
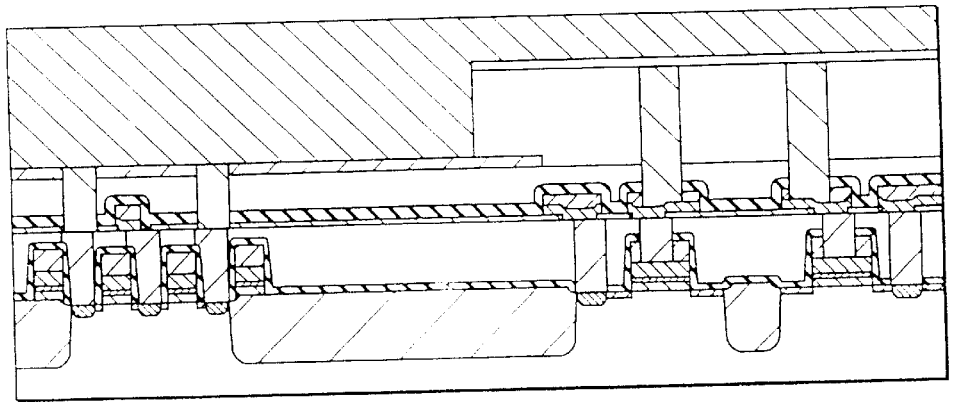
FIG. 23 is a sectional view showing a step in fabrication of a semiconductor memory device of the present invention.
Figure 25:
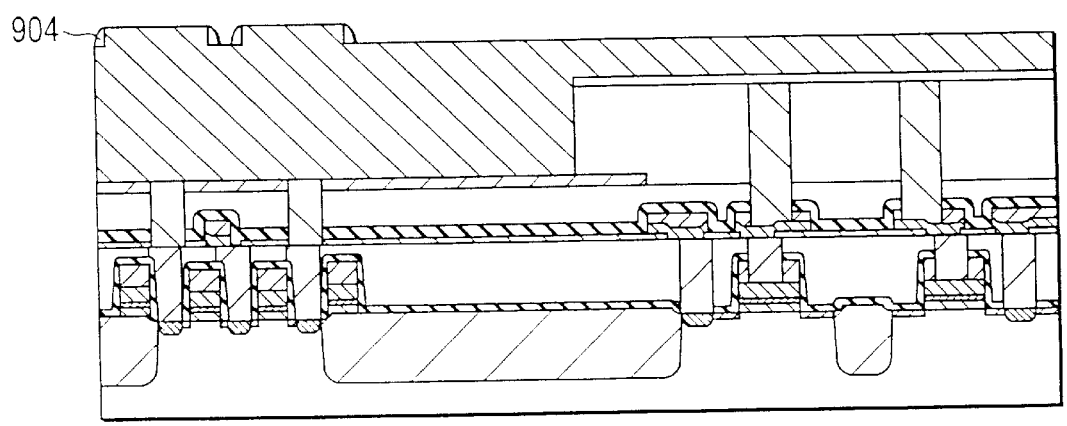
FIG. 25 is a sectional view showing a step in fabrication of a semiconductor memory device of the present invention.
Figure 26:
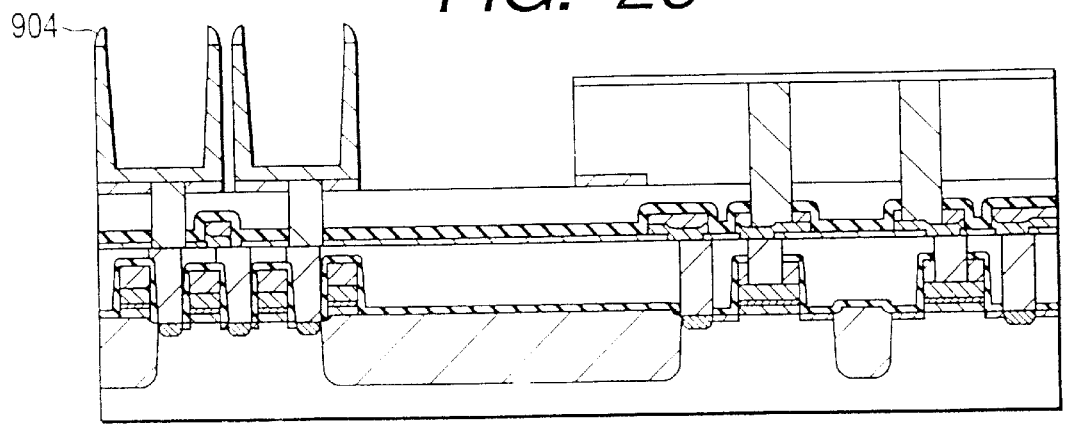
FIG. 26 is a sectional view showing a step in fabrication of a semiconductor memory device of the present invention.
Figure 27:
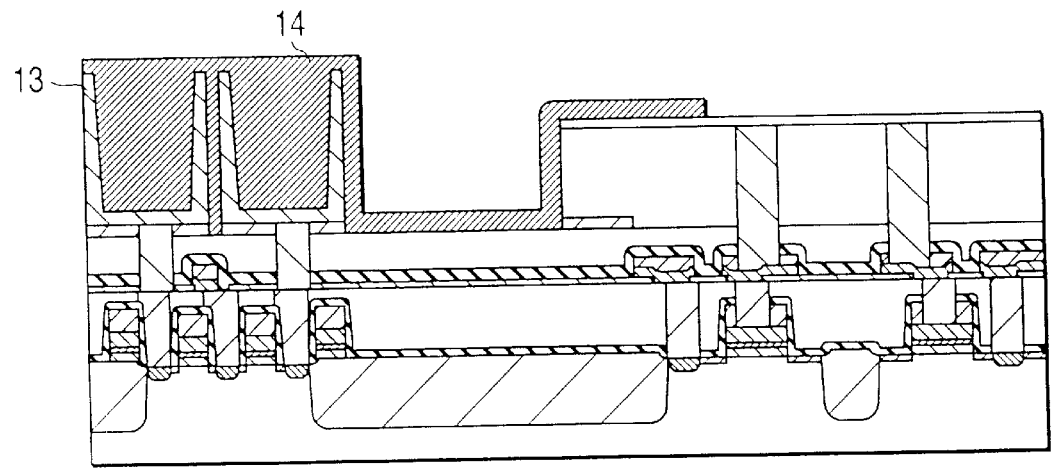
FIG. 27 is a sectional view showing a step in fabrication of a semiconductor memory device of the present invention.
Figure 28:
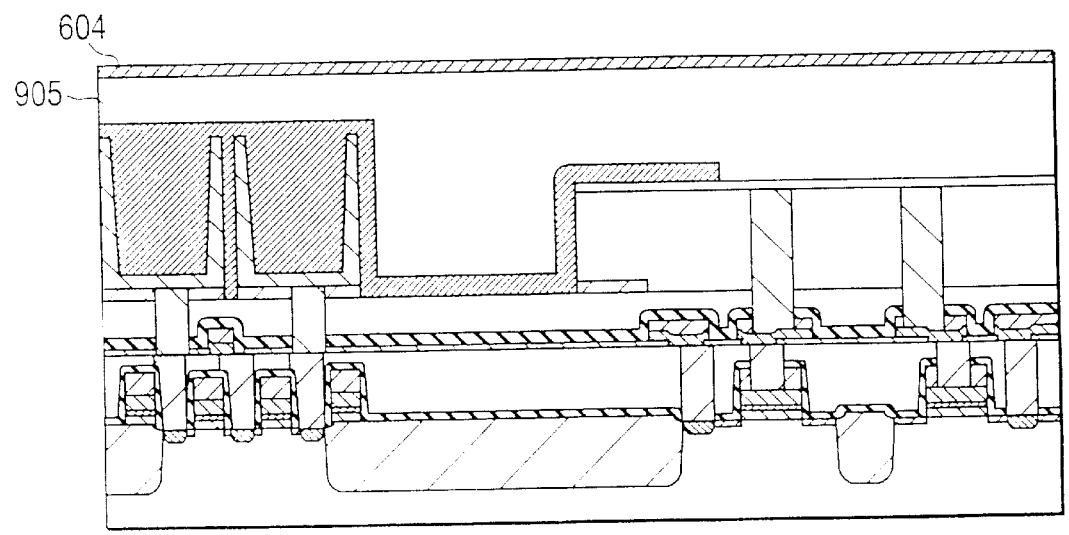
FIG. 28 is a sectional view showing a step in fabrication of a semiconductor memory device of the present invention.
Figure 29:
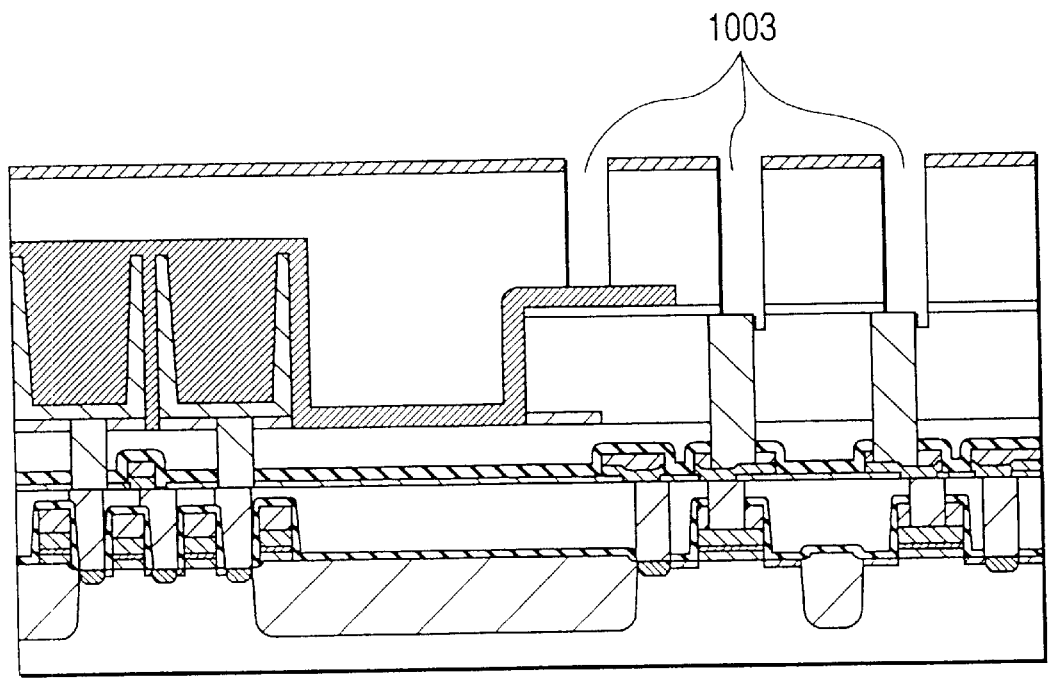
FIG. 29 is a sectional view showing a step in fabrication of a semiconductor memory device of the present invention.
Figure 30:
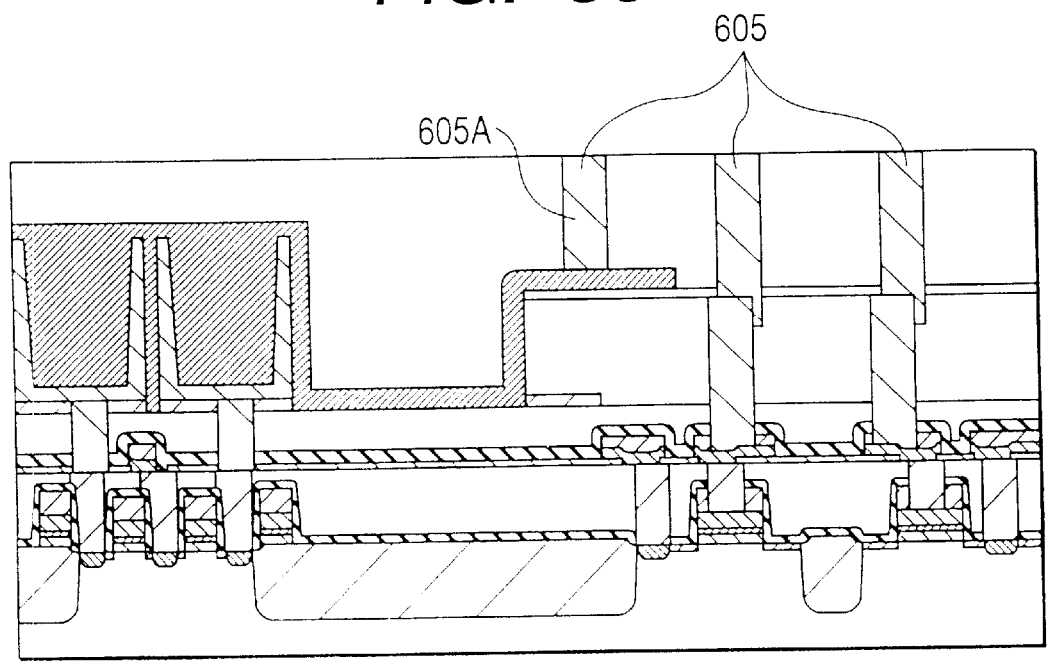
FIG. 30 is a sectional view showing a step in fabrication of a semiconductor memory device of the present invention.

In the process of being planar, as shown in FIG. 22, the bottom of the topological difference in the memory cell array region was covered with resist 1101 to a thickness of 0.6 μm, and the covering with the resist 1101 was repeated so that all the surface was made planar. In an etching-back process applied to the surface which was partially covered with the resist, the polysilicon was partially etched back and after the etching-back process the resist was removed, so that the surface of the polysilicon layer 1201 was made totally planar, as shown in FIG. 23. Processing for formation of a lower electrode of a capacitor follows. First, the surface portion of the polysilicon layer 1201 was etched off by 100 nm in thickness using a resist mask. A sidewall oxide film 904 with a thickness of 50 nm was formed on the side wall of a disc-like protrusion as shown in FIG. 25. The polysilicon layer 1201 was then dry-etched using a sidewall oxide film 904 as a mask, as shown in FIG. 26. The sidewall oxide films 904, which were disposed in the memory cell array region, are removed, a tantalum oxide film with an effective oxide thickness of 3.3 nm as an insulating film of a capacitor was then deposited and TiN 14, which worked as an upper electrode, was deposited to a thickness of 100 nm on the tantalum oxide film. The TiN 14 was partly processed by dry-etching as shown in FIG. 27. An oxide film 905 as an interlayer insulating film was deposited to a thickness of 300 nm on the dry-etched surface, the oxide film 905 was then processed to be planar and W 604 was spattered to a thickness of 50 nm as shown in FIG. 28 The W layer was processed using a resist mask and the SiO2 film 905 was then processed using the processed W as a mask to form holes therein, as shown in FIG. 29. Subsequently, W 605 was deposited to a thickness of 150 nm and the W 605 was then etched back by 200 nm in thickness from the surface as shown in FIG. 30. At the last step, two Al interconnection layers were formed to complete a desired semiconductor memory device, as shown in FIG. 1.

Embodiment 2

Figure 31:
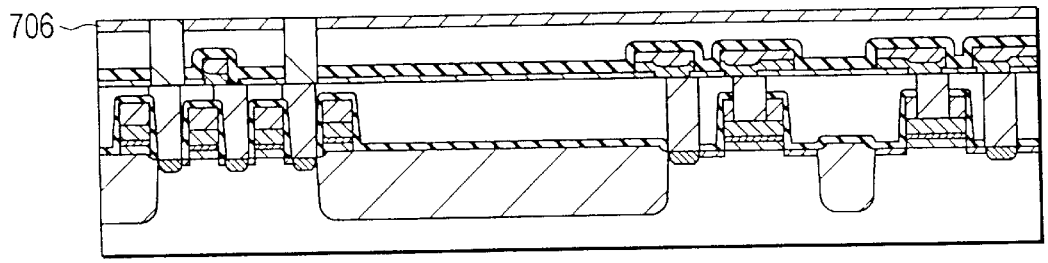
FIG. 31 is a sectional view showing a step in fabrication of a semiconductor memory device of the present invention.
Figure 32:
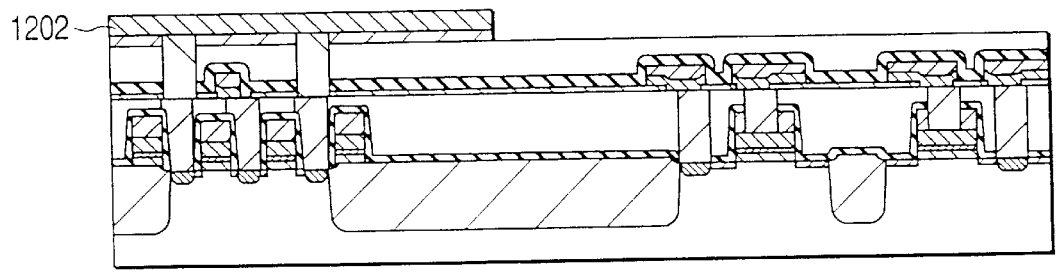
FIG. 32 is a sectional view showing a step in fabrication of a semiconductor memory device of the present invention.
Figure 33:
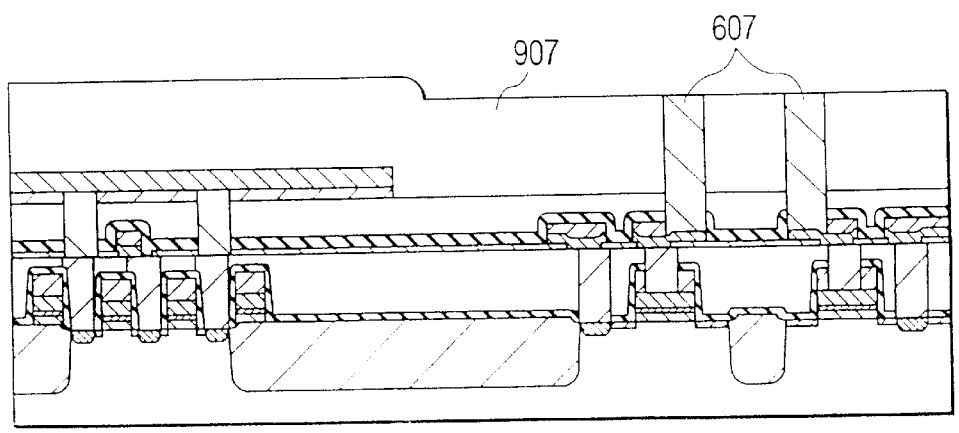
FIG. 33 is a sectional view showing a step in fabrication of a semiconductor memory device of the present invention.
Figure 34:
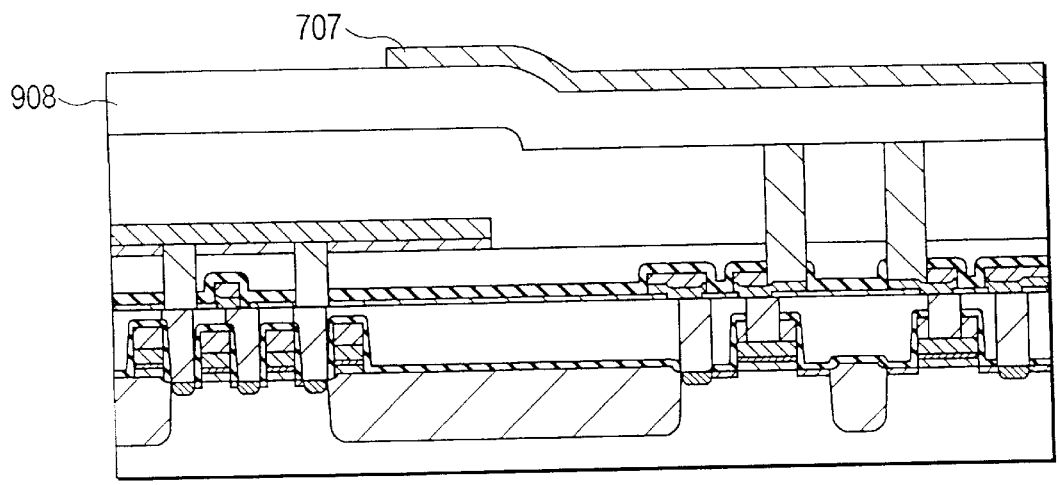
FIG. 34 is a sectional view showing a step in fabrication of a semiconductor memory device of the present invention.
Figure 35:
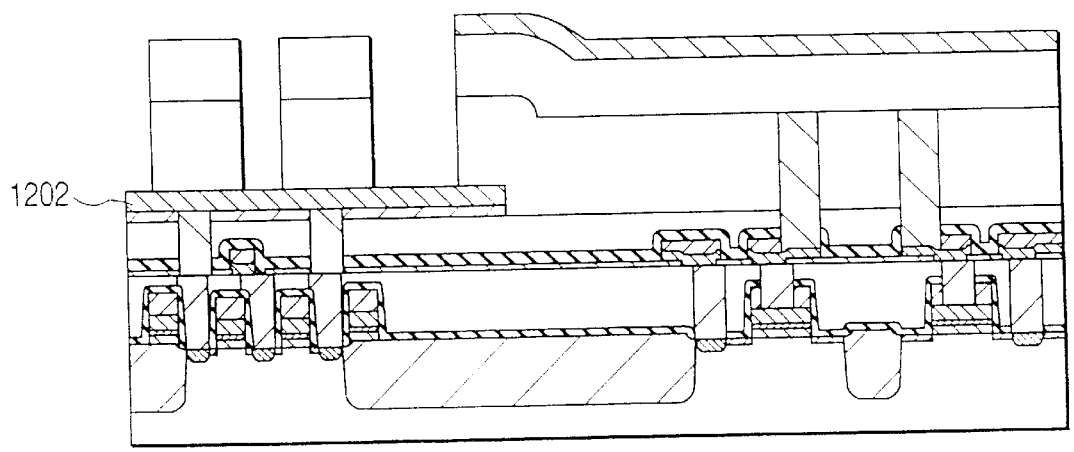
FIG. 35 is a sectional view showing a step in fabrication of a semiconductor memory device of the present invention.
Figure 36:
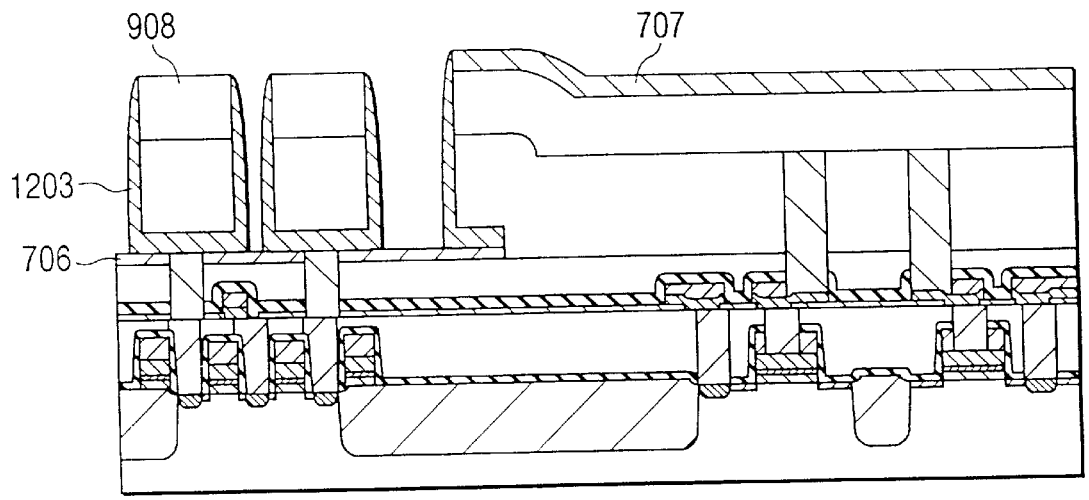
FIG. 36 is a sectional view showing a step in fabrication of a semiconductor memory device of the present invention.
Figure 37:
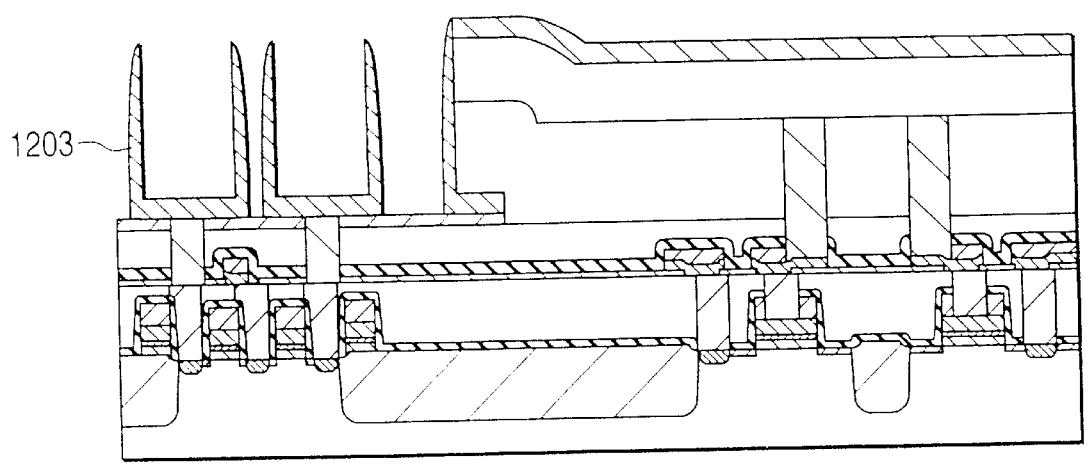
FIG. 37 is a sectional view showing a step in fabrication of a semiconductor memory device of the present invention.
Figure 38:
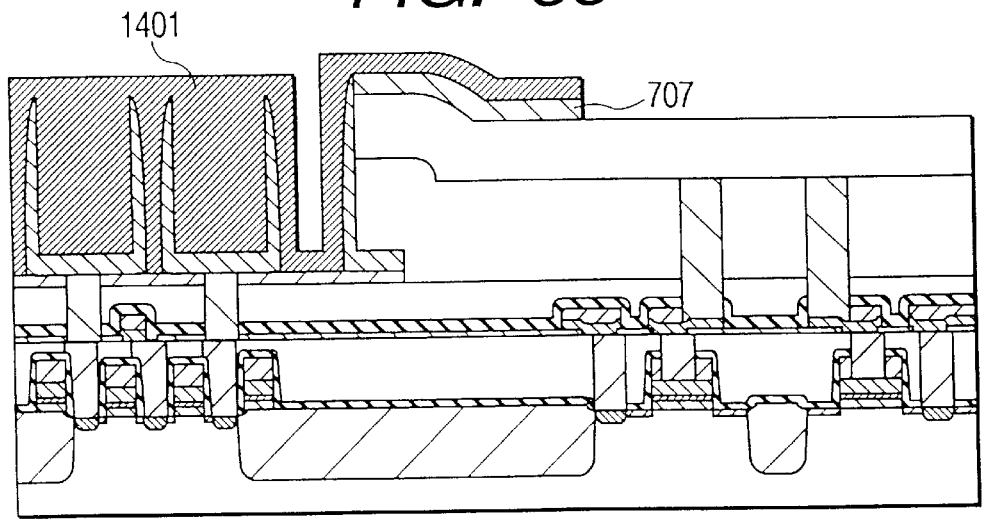
FIG. 38 is a sectional view showing a step in fabrication of a semiconductor memory device of the present invention.

The second embodiment is also an example of a DRAM of a cylinder type in which a topological difference between a memory cell array region and peripheral circuit region is reduced by using a recess structure. There is a difference from the structure in the first embodiment in a way of forming a lower electrode. In the process of fabrication of the second embodiment, steps from a start up to a step depicted in FIG. 15 are common with those of the first embodiment. Description is started with the state depicted in FIG. 15. SiN 706 was deposited to a thickness of 50 nm by means of a CVD method, the SiN film 706 was processed to open contacts using a resist mask, dry-etching was applied to selectively remove the oxide film and SiN, which was followed by formation of plug electrodes made of TiN, as shown in FIG. 31. The SiN was later used as an etching-stopper in a process of forming a capacitor. Subsequently, polysilicon 1202 containing phosphorus at a concentration of $4 \times 10^{20}$ cm$^{-3}$ was deposited to a thickness of 100 nm, the polysilicon 1202 was processed by dry etching together with the SiN as shown in FIG. 32. Then an oxide film 907 with a thickness of 500 nm and a tungsten film with a thickness of 50 nm were deposited in this order. The tungsten film was processed to make openings by a resist mask and after removal of the resist mask, the oxide film 907 and the SiN were dry-etched, which was followed by formation of W plugs 607 in a CVD method and an etching-back process, as shown in FIG. 33. Next, an oxide film 908 with a thickness of 300 nm and SiN 707 with a thickness of 100 nm were deposited and the SiN 707 was processed only to cover all the peripheral circuit region, as shown in FIG. 34. The SiN film 707 left and oxide films 908 and 907 were dry-etched in the memory cell array region to expose the polysilicon layer 1202. Polysilicon 1203 with a high concentration of phosphorus was deposited to a thickness of 50 nm by CVD and the polysilicon 1203, 1202 was dry-etched by 150 nm in thickness to expose the SiN 706 as a substrate, as shown in FIG. 36. As a result, the oxide film 908 in the peripheral circuit region was covered with the SiN 707 on the upper portion thereof and with the polysilicon 1203 on the side portion thereof was covered and only the oxide film 908 in the memory cell array region was exposed. The oxide film 908 in the memory cell region was removed by wet etching, as shown in FIG. 37. A tantalum oxide film of an effective oxide thickness of 3.3 nm was deposited as a capacitor insulating film, TiN 1401 was deposited to a thickness of 100 nm as an upper electrode and dry-etching was applied to process the TiN 1401 and SiN 707 as shown in FIG. 38. Thereafter, two Aluminum interconnection layers were formed in a similar way to the first embodiment to complete an desired semiconductor memory device.

Embodiment 3

Figure 39:
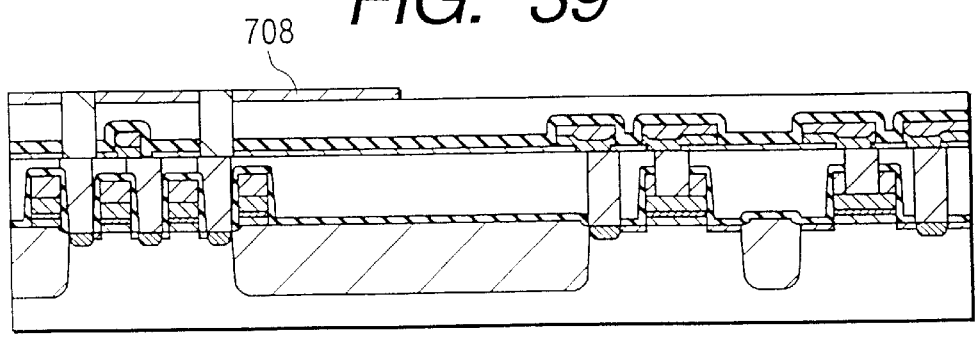
FIG. 39 is a sectional view showing a step in fabrication of a semiconductor memory device of the present invention.
Figure 40:
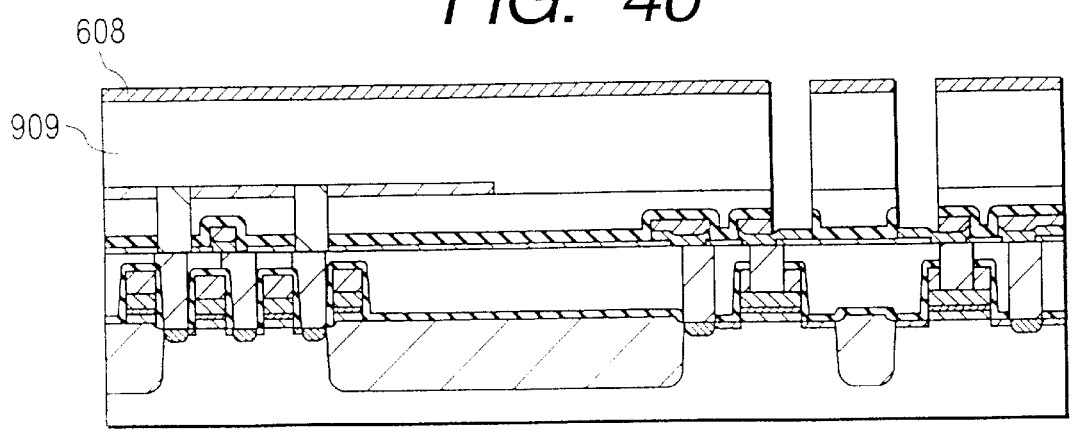
FIG. 40 is a sectional view showing a step in fabrication of a semiconductor memory device of the present invention.
Figure 41:
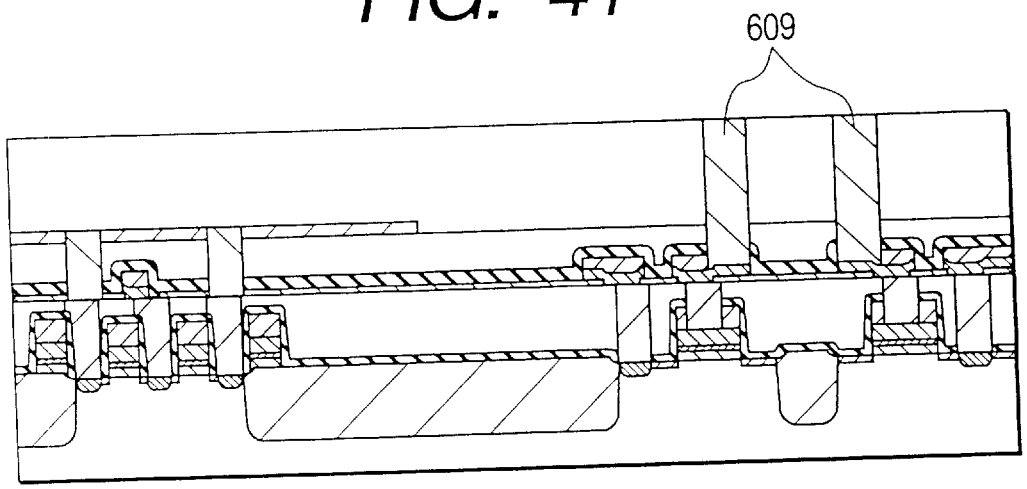
FIG. 41 is a sectional view showing a step in fabrication of a semiconductor memory device of the present invention.
Figure 42:
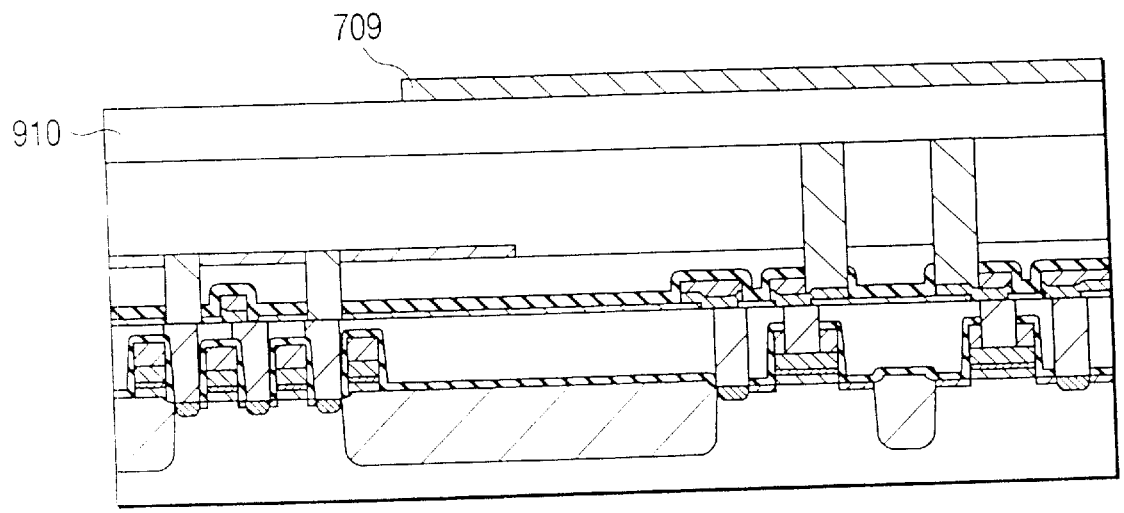
FIG. 42 is a sectional view showing a step in fabrication of a semiconductor memory device of the present invention.
Figure 43:
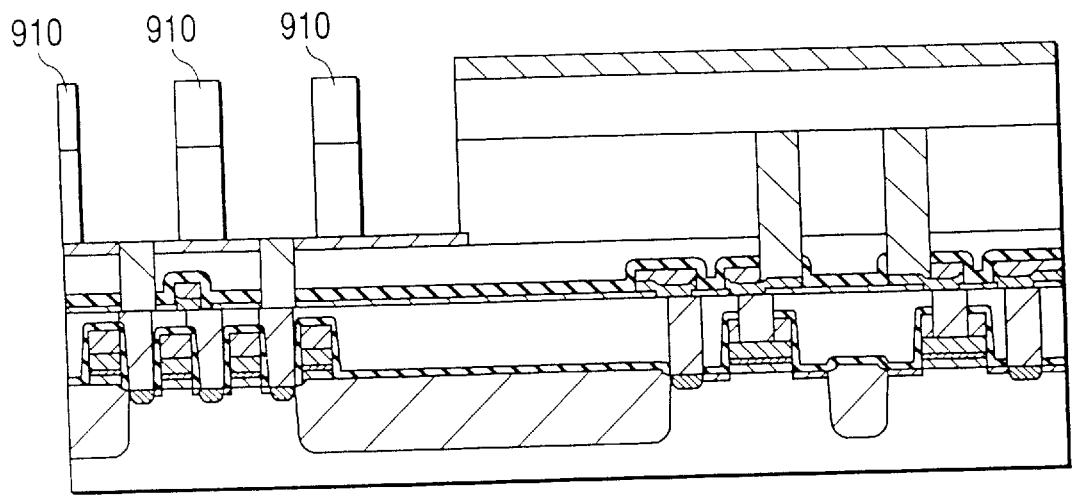
FIG. 43 is a sectional view showing a step in fabrication of a semiconductor memory device of the present invention.
Figure 44:
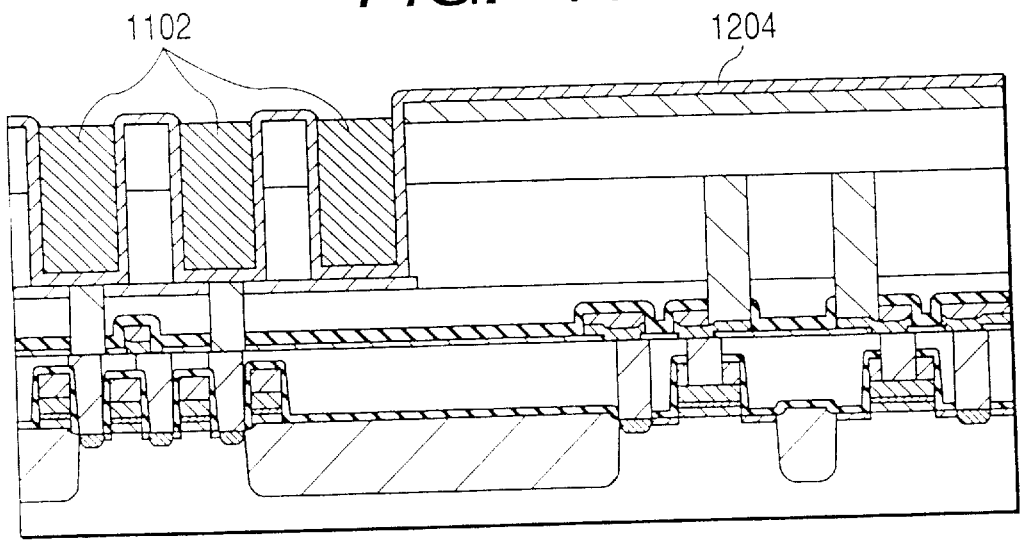
FIG. 44 is a sectional view showing a step in fabrication of a semiconductor memory device of the present invention.
Figure 45:
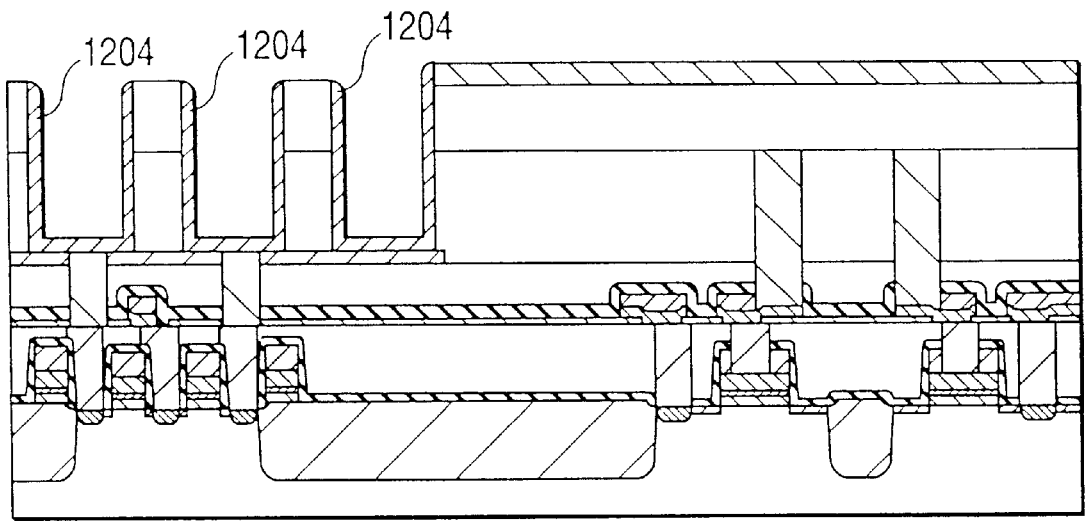
FIG. 45 is a sectional view showing a step in fabrication of a semiconductor memory device of the present invention.
Figure 46:
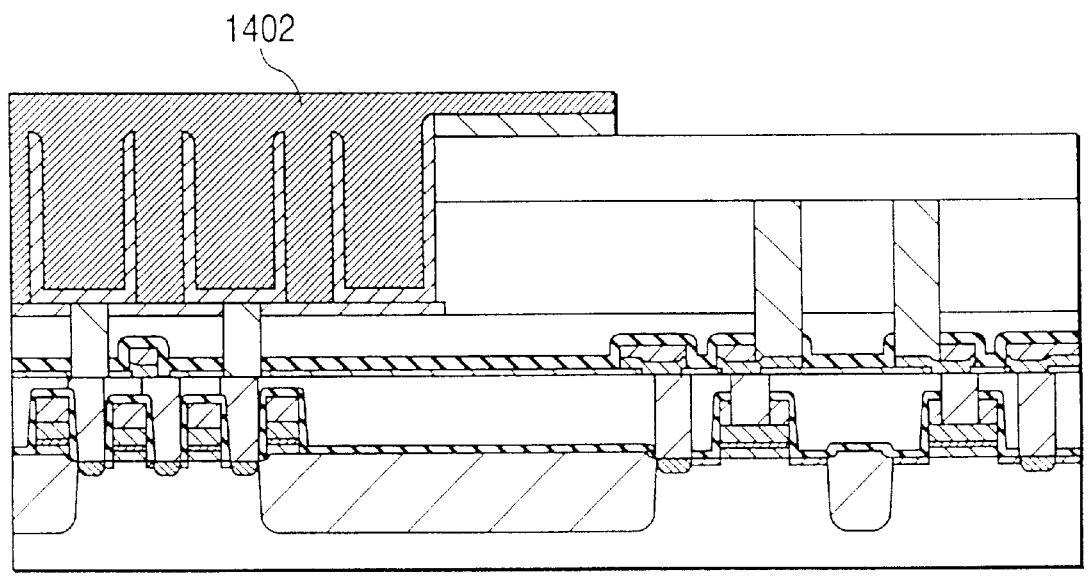
FIG. 46 is a sectional view showing a step in fabrication of a semiconductor memory device of the present invention.

The third embodiment proposes to use a polysilicon film deposited on the inner wall of an oxide film trench. Steps for a starter to a step shown in FIG. 31 of the third embodiment are common with those of the first and second embodiments. Starting with the state of the device in process depicted in FIG. 31, SiN 708 was formed so as to cover the memory cell array region on the surface as shown in FIG. 39. An oxide film 909 with a thickness of 500 nm and tungsten film 608 with a thickness of 50 nm were deposited in this order. The tungsten film 608 was processed using a resist mask and the oxide film 909 was in turn processed using the processed tungsten film 608 as a mask to obtain the device in process shown in FIG. 40. Then W plugs 609 were formed using an etching-back process, as shown in FIG. 41. An oxide film 910 was further formed to a thickness of 300 nm on the surface, SiN 709 was deposited to a thickness of 100 nm thereon and thereafter the SiN 709 was processed so as to cover only the peripheral circuit region, as shown in FIG. 42. As shown in FIG. 43, the SiN 709 and SiO2 910 were processed to form trenches in the memory cell region. Polysilicon 1204 containing phosphorus at a concentration of $4 \times 10^{20}$ cm$^{-3}$ was deposited to a thickness of 50 nm on all the surfaces. Then an etching-back process was applied to the deposition and resist 1102 was stuffed in the trenches as shown in FIG. 44. Dry-etching was applied to remove exposed polysilicon 1204 on the surface and the resist stuffed in the trenches was removed, as shown in FIG. 45. A tantalum oxide film having an effective oxide thickness of 3.3 nm as a capacitor insulating film was deposited in the trenches and TiN 1402 which was to work as an upper electrode was further deposited to a thickness of 100 nm. Dry-etching was applied to process the TiN and SiN to obtain a structure as shown in FIG. 46. Thereafter, for example, two aluminum interconnection layers were formed and the desired device was completed in a similar way to the first embodiment.

Figure 47:
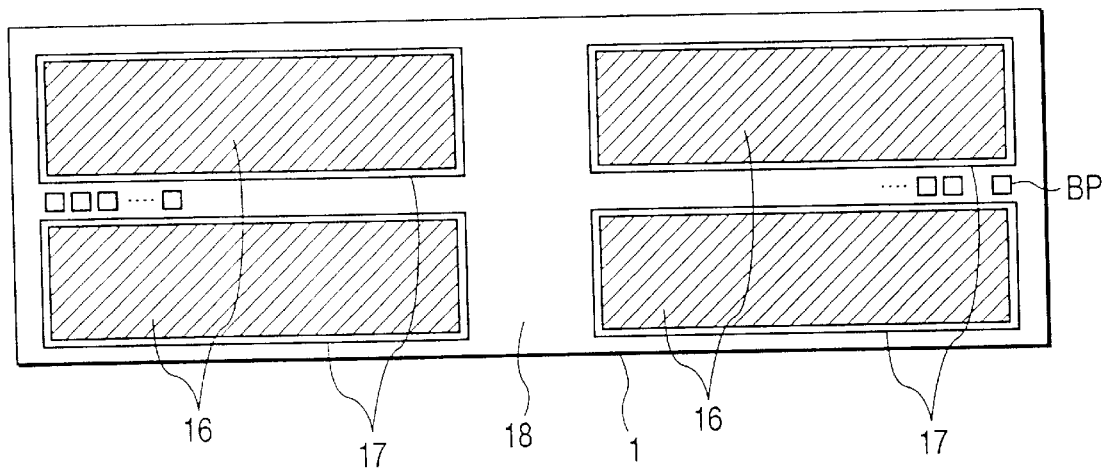
FIG. 47 is a plan view showing a chip layout of the semiconductor memory device according to an embodiment of the present invention.

A plan view of an example of a chip layout of a DRAM according to the present invention is shown in FIG. 47. In FIG. 47, a peripheral circuit region 18 occupies an area in the shape of a cross in a chip in such a manner that the peripheral circuit region 18 surrounds, though partly, four memory cell array regions 16. In the peripheral circuit region 18, an interlayer insulating film 17 (a first interlayer insulating film) is formed in an adjoining relation with the memory cell array region 16 in a surrounding manner. Bonding pads are arranged on a longitudinal central line on a main surface of the peripheral circuit region 18 of the chip.

Figure 48:
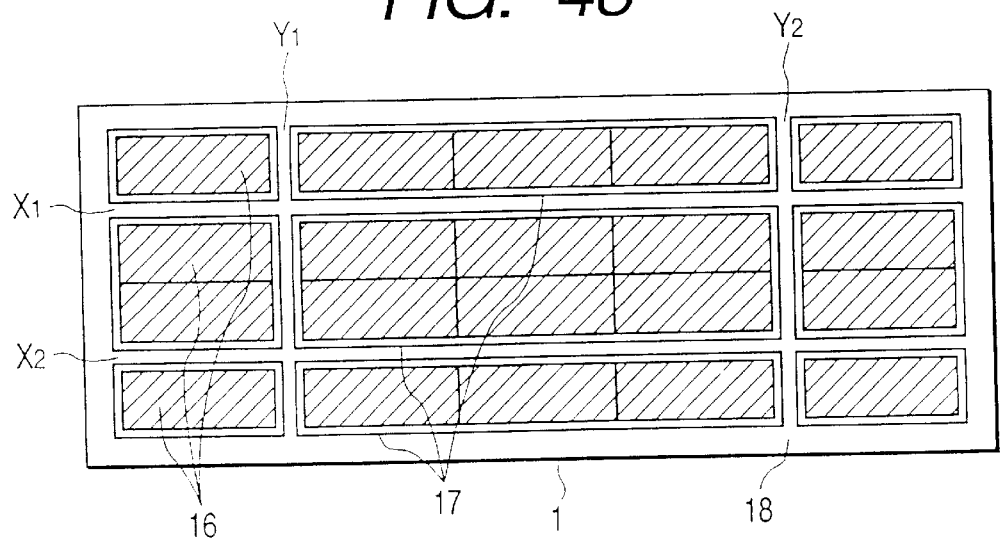
FIG. 48 is a plan view showing a chip layout of the semiconductor memory device according to another embodiment of the present invention.
Figure 49:
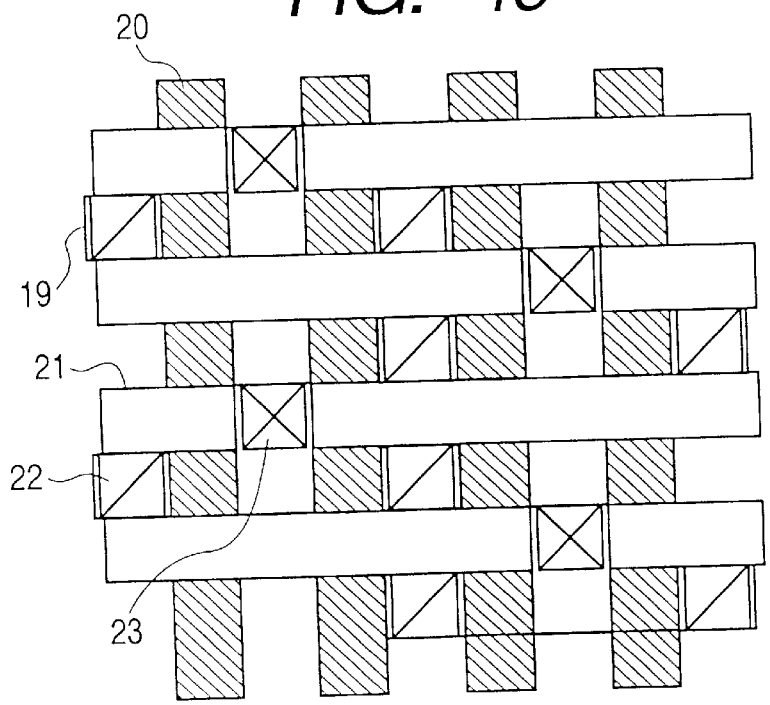
FIG. 49 is a plan view showing a mask layout of the semiconductor memory device according to an embodiment of the present invention.

A plan view of another example of a chip layout according to the present invention is shown in FIG. 48. A DRAM chip shown in FIG. 48 is a DRAM having a large capacity of 1 G bits or more. In FIG. 48, a plurality of memory cell array regions 16 are surrounded by a peripheral circuit region 18 in the periphery of the chip and peripheral circuit regions 18 along X1 and X2 directions and Y1 and Y2 directions. In each of the peripheral circuit regions 18, an interlayer insulating film 17 (a first interlayer insulating film) is formed in an adjoining relation with a memory cell array region 16 in a surrounding manner. Bonding pads (not shown) are arranged on a straight line on peripheral circuit regions 18 along the longitudinal directions X1 and X2, both or singly, on a main surface of the chip 1. In FIG. 49, a mask layout of a memory cell array region according to the present invention is shown. In the present invention, a folded-bitline arrangement having an excellent an anti-noise capability was adopted. The arrangement had a T-shaped active region 19 and thereby the datalines 21 were linear, so that a structure which was easy to resolve in photolithography was available in the arrangement. The width of a data-line 21 and the distance between adjoining data-lines 21 were both 0.16 $\mu$m. A word-line 20 having a width of 0.15 $\mu$m were arranged with a pitch of 0.32 $\mu$m. A storage contact 22 and bit-line contact both were a square having a side of 0.15 $\mu$m in length.

Embodiment 4

Figure 50:
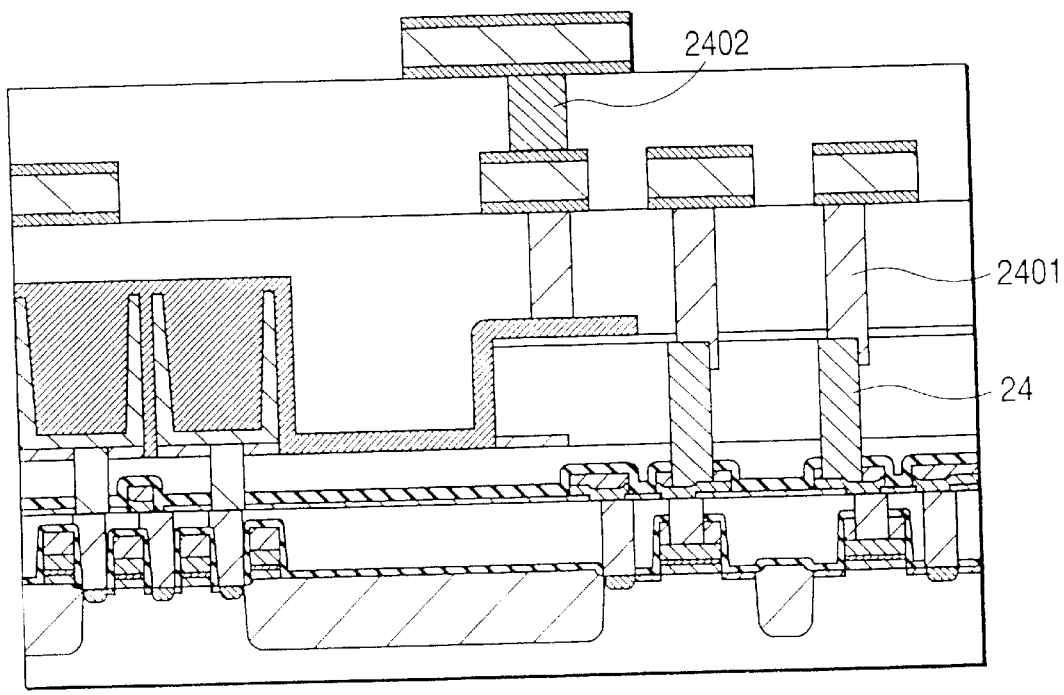
FIG. 50 is a sectional view of a semiconductor memory device of the present invention.

In FIG. 50, a sectional view of a semiconductor memory device according to the fourth embodiment is shown. In the embodiment, one of the connected plugs was made a material different from the other. Steps similar to those in the first embodiment were employed in fabrication of the device. Since a lower plug 24 is formed before a process of forming a capacitor of a memory cell, a heat resistance of the order of 800° C. is required. Under consideration of such a condition, tungsten was used as a material of the lower plug 24. On the other hand, since an upper plug 2401 is formed after the process of forming a capacitor, there is no need for a heat resistance, that is a conductive material having a melting point equal to or lower than the above temperature can be used. Therefore, aluminum having a low resistivity was used as the material. Needless to say that copper can be used as a material of an upper plug 2401. While, as a material of a connecting plug 2402 between interconnect layers, aluminum was used in the embodiment, either copper or tungsten can be used, since there is no requirement for a heat resistance for the material.

Embodiment 5

Figure 51:
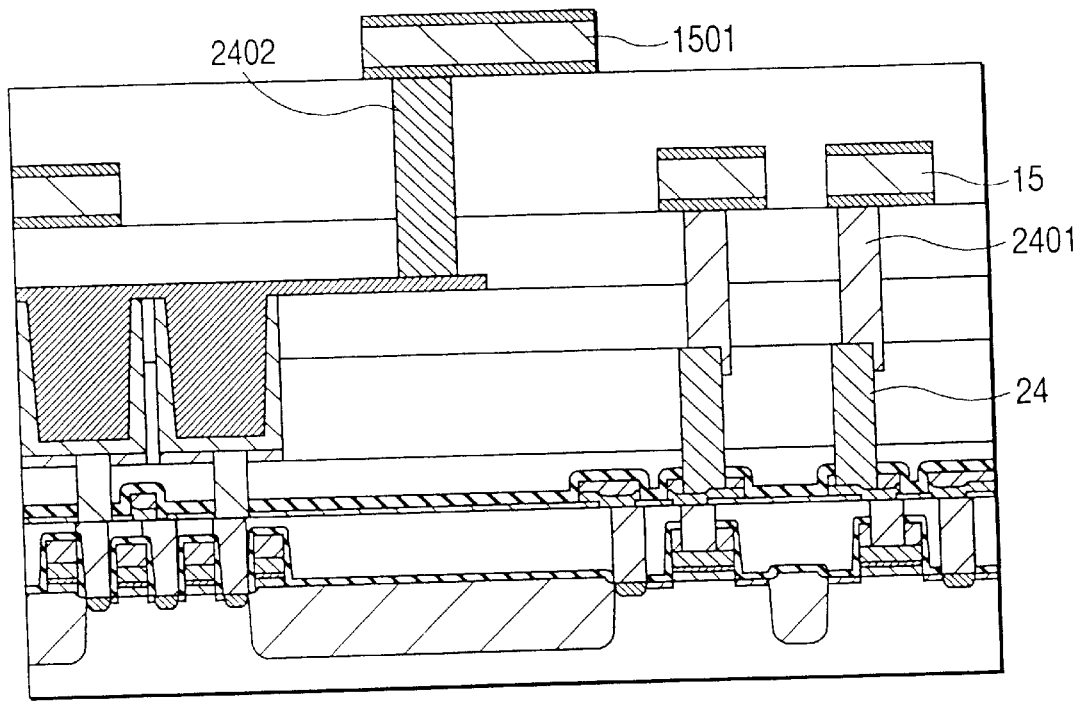
FIG. 51 is a sectional view of a semiconductor memory device of the present invention.

In FIG. 51, a sectional view of a semiconductor memory device according to the fifth embodiment is shown. In this embodiment, too, as steps of fabrication, there were formed lower plugs 24 in a peripheral circuit region, and memory capacitors and upper plugs 2401 in this order. Capacitors were formed in trenches of oxide films deposited on bit-lines. In this case, only an inner wall of a cylindrical lower electrode was used and therefore the surface area of a capacitor was about half of each of those in the embodiments described above. As a result, while the height of a capacitor which was required for securing a necessary capacitance was about 1.5 $\mu$m, this structure had a feature that there arose no topological difference between the peripheral circuit and memory cell array regions, the feature having not been found in the embodiments described above. In this case, as shown in FIG. 51, since an upper electrode 14 of a capacitor is located higher than the lower plugs 24 in the peripheral circuit region, a power supply to the upper electrode 14 of a capacitor was effected from an interconnect line 1501 instead of an interconnect line 15. In such a structure, since the number of contacts is decreased, there is a further feature that large room for a layout of interconnect lines 15 is available.

Embodiment 6

Figure 52:
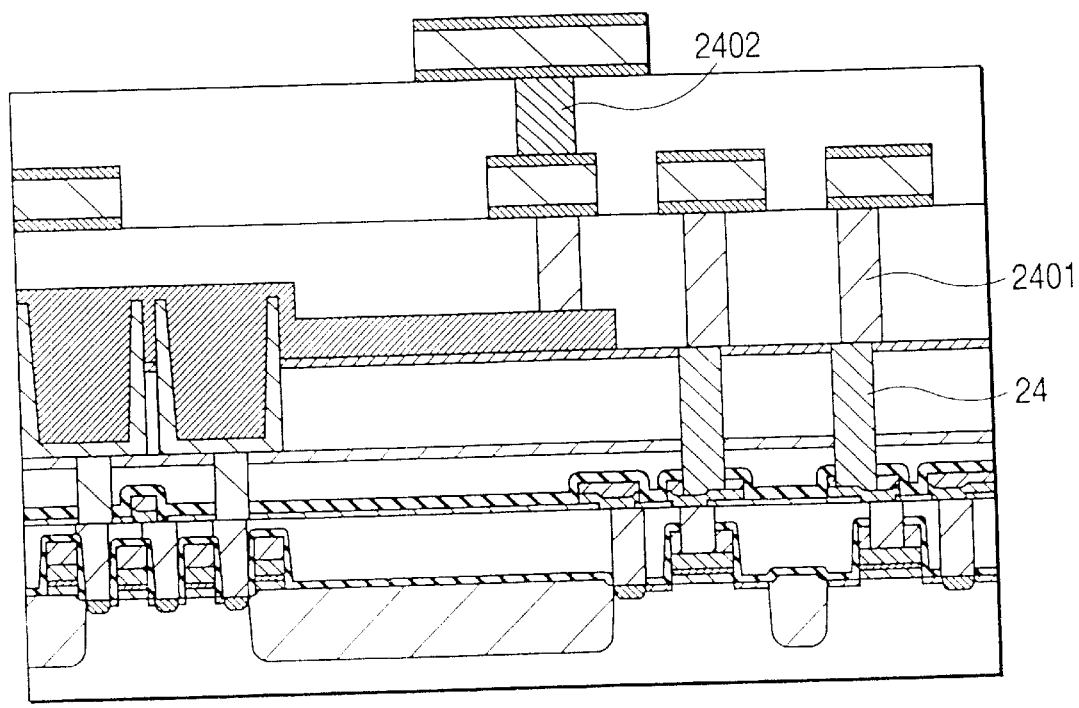
FIG. 52 is a sectional view of a semiconductor memory device of the present invention.

In FIG. 52, a sectional view of a semiconductor memory device according to the fifth embodiment is shown. A characteristic feature of the embodiment reside in its capacitor. That is, the capacitor has a structure wherein the surface of the capacitor comprises the inner side surface of a cylindrical lower electrode and the upper half of the outer side surface thereof. As a result, since the capacitor surface area is larger than that of the capacitor of the fifth embodiment shown in FIG. 5, the height of the capacitor can be decreased.

Embodiment 7

Figure 53:
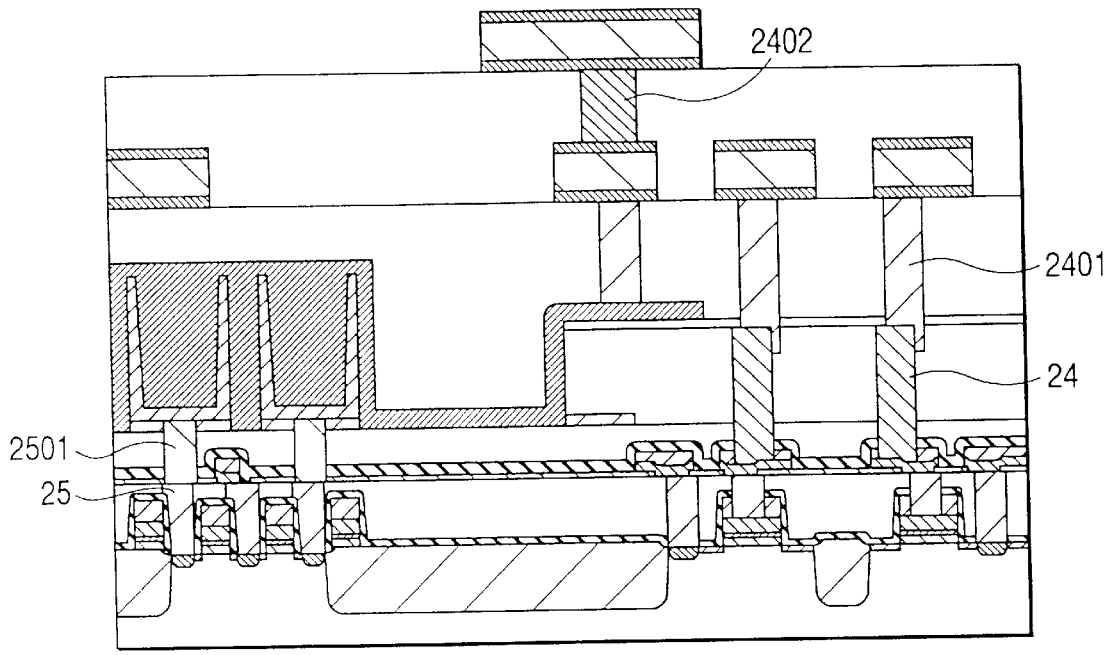
FIG. 53 is a sectional view of a semiconductor memory device of the present invention.

FIG. 53 is a sectional view of a semiconductor memory device according to the seventh embodiment wherein polysilicon was used as a material of a plug in the memory cell array region. As a result, metal contamination was alleviated and leakage current associated with a memory cell array was able to be decreased.

Embodiment 8

Figure 54:
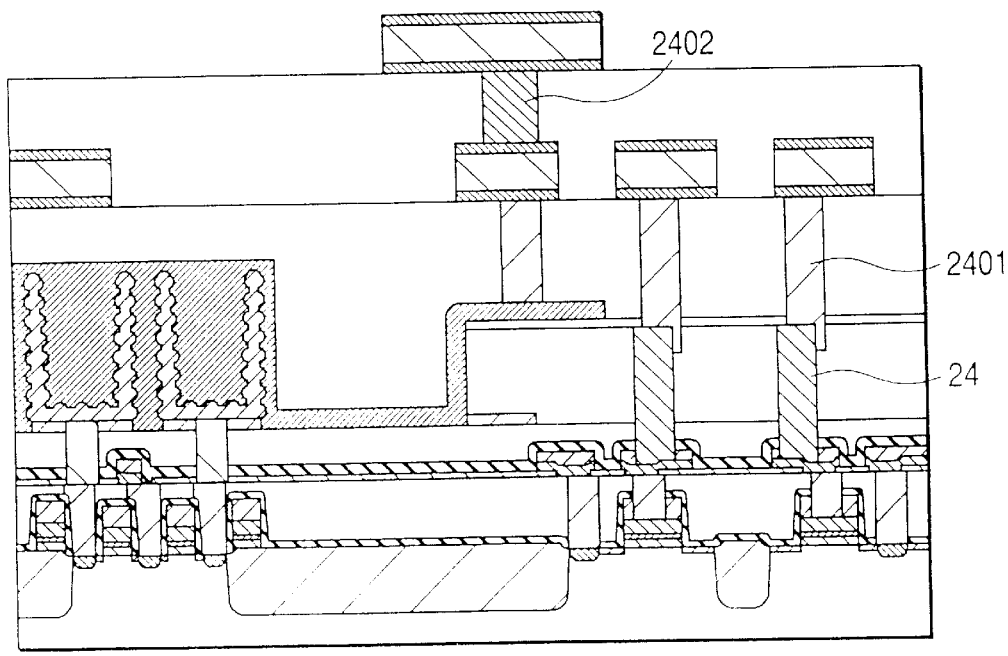
FIG. 54 is a sectional view of a semiconductor memory device of the present invention.
Figure 55:
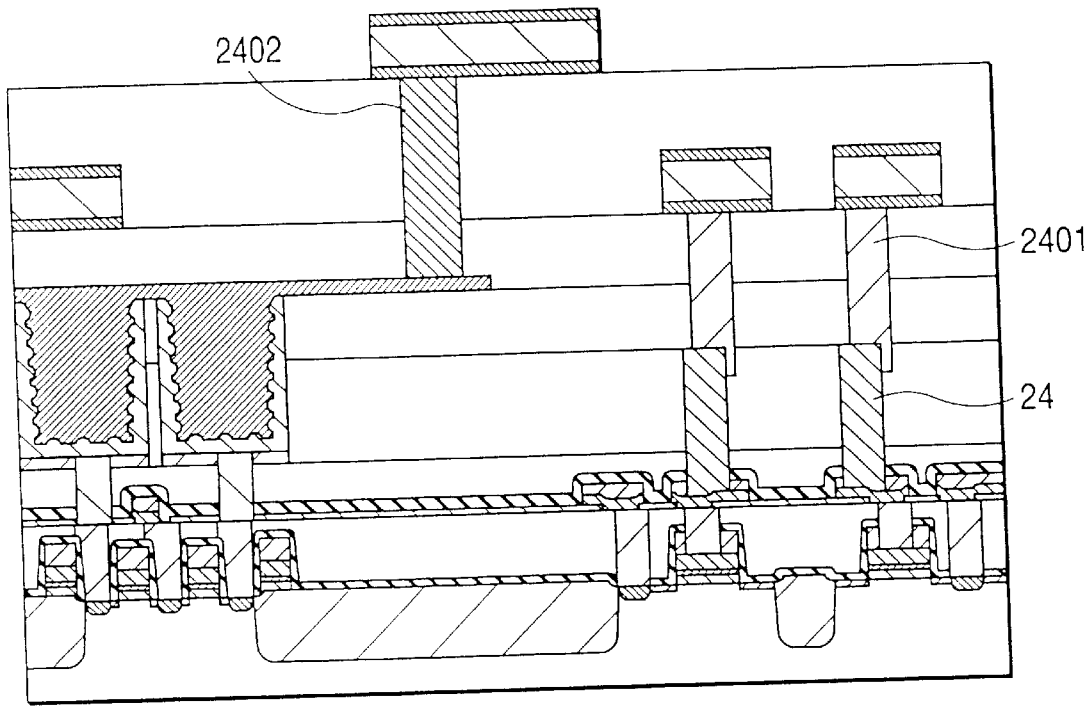
FIG. 55 is a sectional view of a semiconductor memory device of the present invention.
Figure 56:
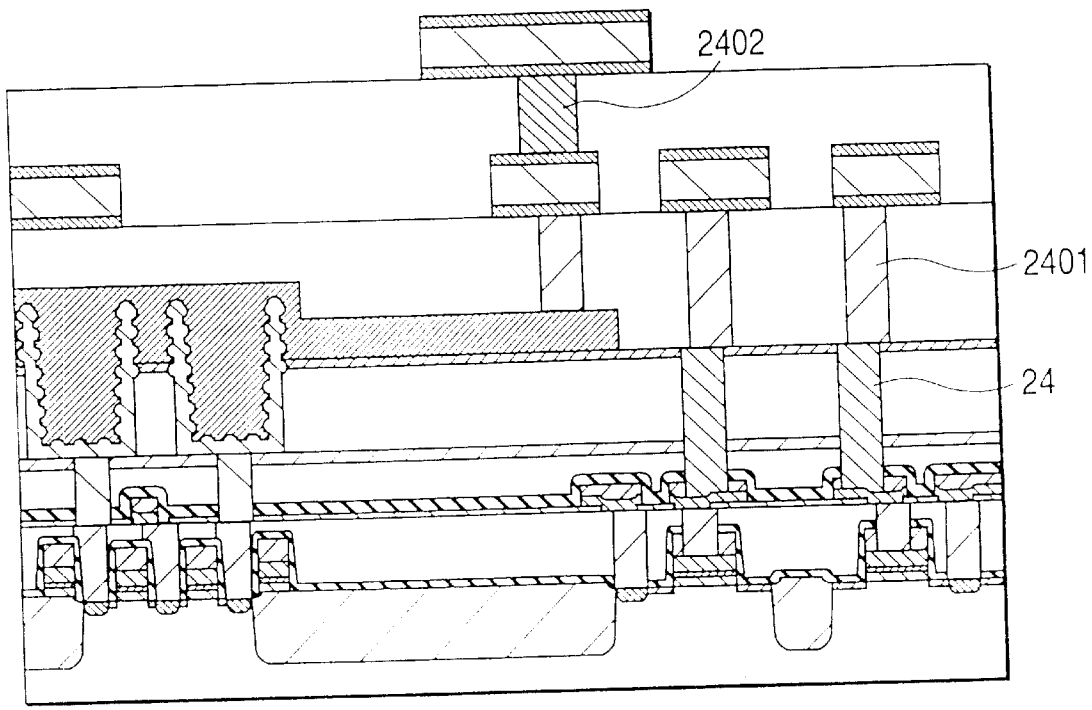
FIG. 56 is a sectional view of a semiconductor memory device of the present invention.

FIGS. 54 to 56 are sectional views of semiconductor memory devices according to the eighth embodiment, wherein different methods of forming a capacitor were adopted in different devices depicted in the figures. As a result, the surface area of a capacitor was increased and thereby the height thereof was decreased to from two-thirds to one half. In this embodiment, while a series formed of a pair of a peak and a valley across a surface were formed by means of etching back of rugged polysilicon, such as a roughened surface can be formed by the use of HSG (Hemi spherical Grain).

Embodiment 9

Figure 24:
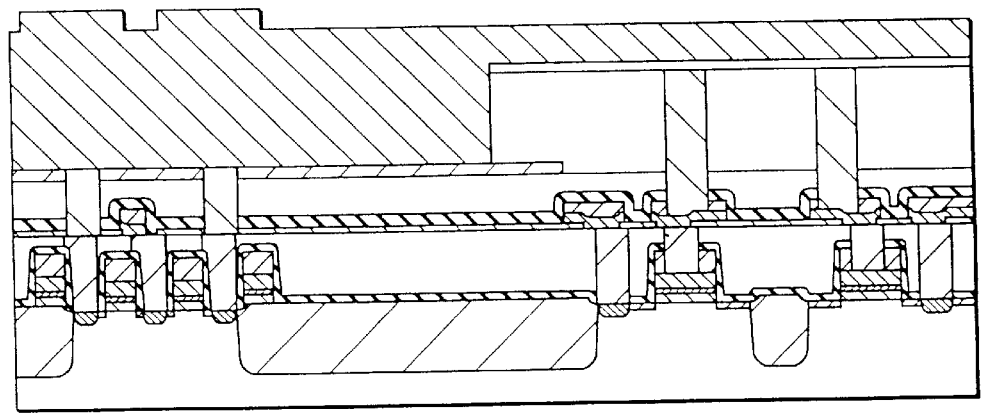
FIG. 24 is a sectional view showing a step in fabrication of a semiconductor memory device of the present invention.
Figure 57:
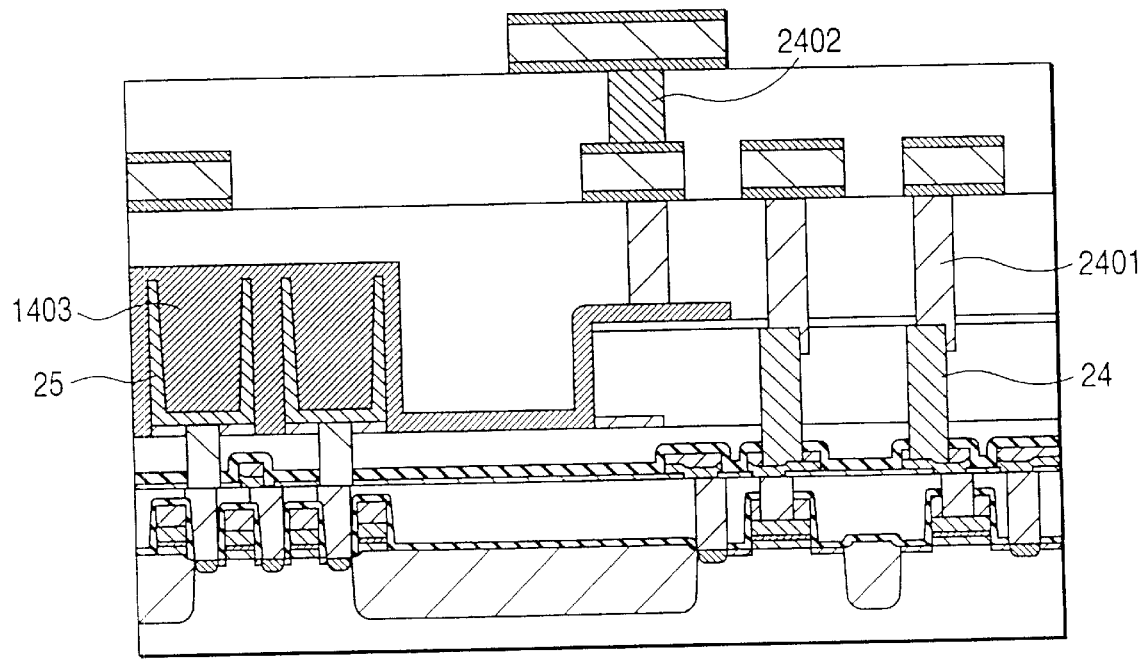
FIG. 57 is a sectional view of a semiconductor memory device of the present invention.

In FIG. 57, a sectional view of a semiconductor memory device according to the ninth embodiment is shown, wherein a film with a high dielectric constant, such as BST or PZT is used as a capacitor insulating film. As for the film, while platinum (Pt) or ruthenium oxide (RuO) has been used For a material of a lower electrode, there is a problem that a three-dimensional electrode is difficult to form, since a CVD step has difficulty. The problem was solved in this embodiment. That is, an oxide film hard mask in the shape of a ring, as shown in FIGS. 24 to 26 of the first embodiment, was employed and thereby a lower electrode 25 made of ruthenium oxide was three-dimensionally processed to be formed, which was able to guarantee a necessary capacitance. In this case, platinum can naturally be used as a material of the lower electrode. In this embodiment, while Al/TiN was used as a material of an upper electrode 1403 of a capacitor, the use of either ruthenium or ruthenium oxide is naturally possible instead Al/TiN.

As can be seen from the above description, it is possible with the present invention to reduce the topological different between a memory cell array region and peripheral circuit region in a chip, this topological difference having become an increasingly serious issue in fabrication of integrated circuits with a continuous increase in complexity of integration, which in turn facilitates interconnections in later steps. Besides, since the topological difference is reduced after bit-lines are formed, a shallow trench isolation technique can be adopted according to the present invention. Moreover, since a plurality of plugs are vertically connected in a peripheral circuit region, the present invention has a feature that each aspect ratio can be smaller and thereby reliability of the process is improved.

What is claimed is:

1. A semiconductor memory device having a memory cell array region and a peripheral circuit region, comprising:

a semiconductor substrate;

a plurality of first transistors formed on a main surface of said semiconductor substrate in said memory cell array region;

a plurality of second transistors formed on the main surface of said semiconductor substrate in said peripheral circuit region;

a first interlayer insulating film covering said plurality of first transistors, said plurality of second transistors and the main surface of said semiconductor substrate;

a plurality of first interconnect lines formed on said first interlayer insulating film;

a second interlayer insulating film covering said plurality of first interconnect lines and the surface of said first interlayer insulating film;

a third interlayer insulating film only covering the surface of said second interlayer insulating film over said peripheral circuit region;

a plurality of storage capacitors formed on the surface of said second interlayer insulating film of said memory cell array region and inside a recess formed by said third interlayer insulating film;

a fourth interlayer insulating film covering said plurality of storage capacitors and an upper surface of said third interlayer insulating film;

a plurality of second interconnect lines formed on said fourth interlayer insulating film;

a first plug formed in a first contact hole which penetrates said third interlayer insulating film; and a second plug formed in a second contact hole which penetrates said fourth interlayer insulating film;

wherein one of said second interconnect lines in said peripheral circuit region is electrically connected to one of said first interconnect lines in said peripheral circuit region via a plurality of plugs which include said first plug and said second plug.

2. A semiconductor memory device according to claim 1, wherein an upper surface of said plurality of storage capacitors is located at a higher level than an upper surface of said third interlayer insulating film.

3. A semiconductor memory device according to claim 1 or 2, further comprising:

a third plug formed in a second contact hole which penetrates said fourth interlayer insulating film;

wherein said plurality of storage capacitors comprise a plurality of storage electrodes, a dielectric film and a plate electrode, wherein part of said plate electrode is extended onto said third interlayer insulating film, and wherein a power supply is provided to said plate electrode via said third plug at the extended part of said plate electrode.

* * * * *